(12) United States Patent
Choi et al.

(10) Patent No.: US 12,396,237 B2
(45) Date of Patent: Aug. 19, 2025

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Young Moon Choi, Seoul (KR); Sung Il Park, Suwon-si (KR); Dae Won Ha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 485 days.

(21) Appl. No.: 17/833,058

(22) Filed: Jun. 6, 2022

(65) Prior Publication Data
US 2023/0084804 A1    Mar. 16, 2023

(30) Foreign Application Priority Data
Sep. 15, 2021 (KR) .................. 10-2021-0122934

(51) Int. Cl.
*H10D 64/23* (2025.01)
*H10D 30/69* (2025.01)

(52) U.S. Cl.
CPC .......... *H10D 64/258* (2025.01); *H10D 30/797* (2025.01)

(58) Field of Classification Search
CPC ........... H01L 29/41775; H01L 29/7848; H01L 29/0673; H01L 29/41766; H01L 29/42392; H01L 29/66439; H01L 29/775; H01L 29/78642; H01L 29/165; H01L 29/66545; H01L 29/78696; H01L 21/8221; H01L 21/823871; H01L 21/823878; H01L 27/0688; H01L 27/092; B82Y 10/00
See application file for complete search history.

(56) References Cited

U.S. PATENT DOCUMENTS

| | | | |
|---|---|---|---|
| 9,673,099 B2 | 6/2017 | Kang et al. | |
| 9,837,414 B1 | 12/2017 | Balakrishnan et al. | |
| 10,283,516 B1 | 5/2019 | Reznicek et al. | |
| 10,546,925 B2 | 1/2020 | Reznicek et al. | |
| 10,741,456 B2 | 8/2020 | Cheng et al. | |
| 11,069,684 B1* | 7/2021 | Xie ................ | H01L 21/823871 |
| 2020/0105751 A1 | 4/2020 | Dewey et al. | |
| 2020/0294866 A1 | 9/2020 | Cheng et al. | |

(Continued)

*Primary Examiner* — Fernando L Toledo
*Assistant Examiner* — Ryan T. Fortin
(74) *Attorney, Agent, or Firm* — Sughrue Mion, PLLC

(57) ABSTRACT

A semiconductor device includes: a first active pattern extending in a first direction; a second active pattern spaced apart extending in the first direction, the first active pattern being provided between the second active pattern and a substrate; a gate structure extending in a second direction, the first active pattern and the second active pattern passing through the gate structure, and the second direction crossing the first direction; a first source/drain area connected with the first active pattern and provided on a side of the gate structure; a second source/drain area connected with the second active pattern and provided on the first source/drain area; a first insulating structure provided between the substrate and the first source/drain area, the first insulating structure not being provided between the substrate and the gate structure; and a second insulating structure provided between the first source/drain area and the second source/drain area.

20 Claims, 30 Drawing Sheets

(56) References Cited

U.S. PATENT DOCUMENTS

| | | | |
|---|---|---|---|
| 2020/0295198 A1* | 9/2020 | Cheng | H01L 29/66742 |
| 2021/0043727 A1* | 2/2021 | Frougier | H01L 29/66553 |
| 2022/0285506 A1* | 9/2022 | Zhu | H10B 51/20 |
| 2022/0406715 A1* | 12/2022 | Xie | H01L 21/0259 |
| 2023/0029232 A1* | 1/2023 | Cheng | H01L 29/78696 |
| 2023/0056372 A1* | 2/2023 | Gardner | H01L 29/66439 |

* cited by examiner

SEMICONDUCTOR DEVICE AND METHOD FOR FABRICATING THE SAME

CROSS-REFERENCE TO RELATED APPLICATION

This application claims priority from Korean Patent Application No. 10-2021-0122934 filed on Sep. 15, 2021 in the Korean Intellectual Property Office, the disclosure of which is incorporated by reference herein its entirety.

BACKGROUND

1. Field

The present disclosure relates to a semiconductor device and a method for fabricating the same, and more particularly, to a semiconductor device including a multi-bridge channel and a method for fabricating the same.

2. Description of Related Art

In order to increase density of an integrated circuit device, a multi-gate transistor for forming a silicon body of a fin shape or a nanowire shape on a substrate and forming a gate on a surface of the silicon body has been suggested.

Due to the increased density, a gate structure may form a leakage path and performance of a semiconductor device may be degraded.

BRIEF SUMMARY

One or more embodiments provide a semiconductor device that has performance improved by a simplified process.

One or more embodiments provide a method for fabricating a semiconductor device having performance improved by a simplified process.

The objects are not limited to those mentioned above and additional objects of, which are not mentioned herein, will be clearly understood by those skilled in the art from the following description.

According to an aspect of an embodiment, a semiconductor device includes: a first active pattern spaced apart from a substrate and extending in a first direction; a second active pattern spaced apart from the substrate and extending in the first direction, the first active pattern being provided between the second active pattern and the substrate; a gate structure extending in a second direction on the substrate, the first active pattern and the second active pattern passing through the gate structure, and the second direction crossing the first direction; a first source/drain area connected with the first active pattern and provided on a side of the gate structure; a second source/drain area connected with the second active pattern and provided on the first source/drain area; a first insulating structure provided between the substrate and the first source/drain area, wherein the first insulating structure is not provided between the substrate and the gate structure; and a second insulating structure provided between the first source/drain area and the second source/drain area.

According to an aspect of an embodiment, a semiconductor device includes: a first sheet pattern provided on a substrate and extending in a first direction; a second sheet pattern provided on and spaced apart from the first sheet pattern, and extending in the first direction; a third sheet pattern provided on the second sheet pattern and extending in the first direction; a fourth sheet pattern provided on and spaced apart from the third sheet pattern, and extending in the first direction; a gate structure provided on the substrate and extending in a second direction which crosses the first direction, wherein the first sheet pattern, the second sheet pattern, the third sheet pattern and the fourth sheet pattern pass through the gate structure; a first source/drain area connected with the first sheet pattern and the second sheet pattern, and provided on a side of the gate structure; a second source/drain area connected with the third sheet pattern and the fourth sheet pattern, and provided on the first source/drain area; a first insulating structure provided between the substrate and the first source/drain area on the side of the gate structure; and a second insulating structure provided between the first source/drain area and the second source/drain area on the side of the gate structure. A thickness of the first insulating structure and a thickness of the second insulating structure are greater than a distance between the first sheet pattern and the second sheet pattern, and greater than a distance between the third sheet pattern and the fourth sheet pattern.

According to an aspect of an embodiment, a semiconductor device includes: a plurality of lower sheet patterns sequentially provided on a substrate, spaced apart from each other, and respectively extending in a first direction; a plurality of upper sheet patterns sequentially provided on the plurality of lower sheet patterns, spaced apart from each other, and respectively extending in the first direction; a gate structure provided on the substrate and extending in a second direction crossing the first direction on the substrate, wherein the plurality of lower sheet patterns and the plurality of upper sheet patterns pass through the gate structure; a first source/drain area connected with the plurality of lower sheet patterns, provided on a side of the gate structure, and having a first conductivity type; a second source/drain area connected with the plurality of upper sheet patterns, provided on the first source/drain area, and having a second conductivity type different from the first conductivity type; a first insulating structure provided between the substrate and the first source/drain area, wherein the first insulating structure is not provided between the substrate and the gate structure; and a second insulating structure provided between the first source/drain area and the second source/drain area on the side of the gate structure. A first distance between the substrate and the plurality of lower sheet patterns and a second distance between the plurality of lower sheet patterns and the plurality of upper sheet patterns are both greater than each of a third distance between two adjacent lower sheet patterns of the plurality of lower sheet patterns, and a fourth distance between two adjacent upper sheet patterns of the plurality of upper sheet patterns.

BRIEF DESCRIPTION OF THE DRAWINGS

The above and other aspects and features will become more apparent from the following description, taken in conjunction with the attached drawings, in which.

DETAILED DESCRIPTION

Embodiments will now be described more fully with reference to the accompanying drawings. Embodiments described herein are all example embodiments, and thus, the inventive concept is not limited thereto, and may be realized in various other forms. Each embodiment provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof.

Hereinafter, a semiconductor device according to exemplary embodiments will be described with reference to FIGS. 1 to 11. It will be understood that, although the terms "first", "second", etc. may be used herein to describe various elements or components, these elements or components should not be limited by these terms. These terms are only used to distinguish one element or component from another element or component. Therefore, a first element or component discussed below could be termed a second element or component without departing from the disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
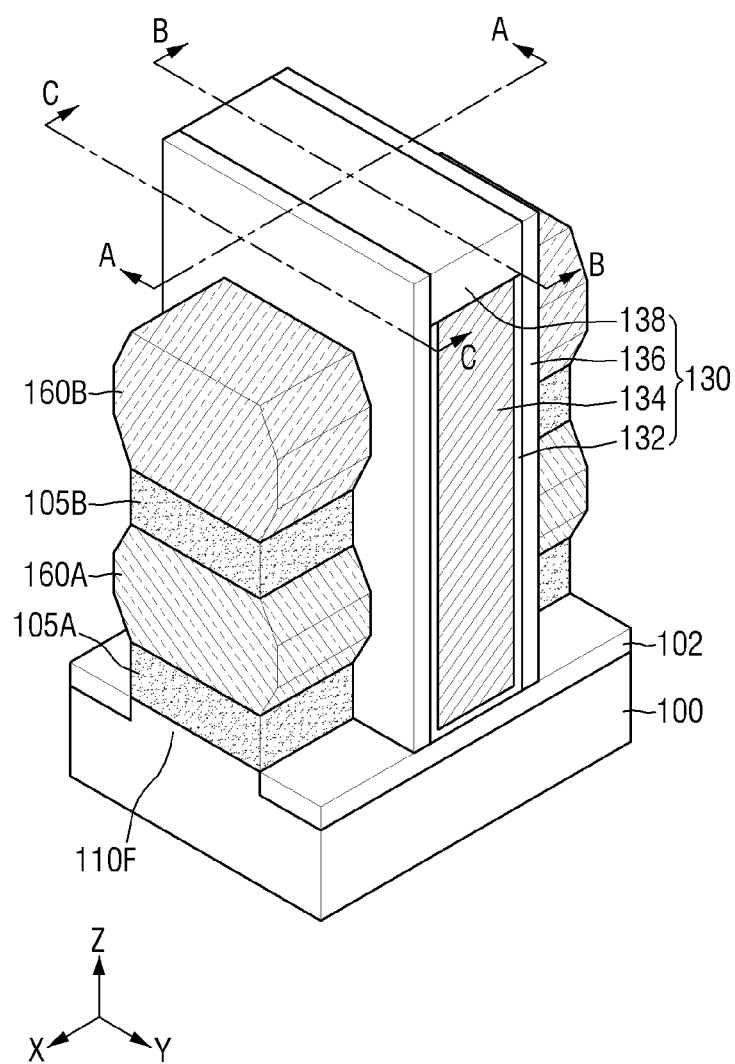
FIG. 1 is a perspective view illustrating a semiconductor device according to some embodiments.
Figure 2:
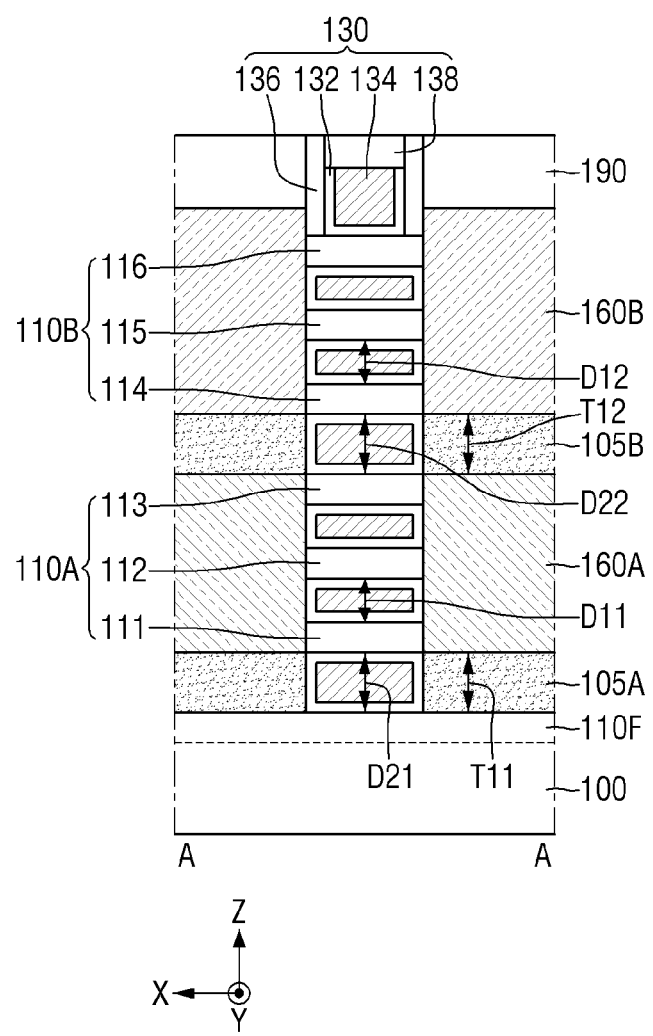
FIG. 2 is a cross-sectional view taken along line A-A of FIG. 1.
Figure 3:
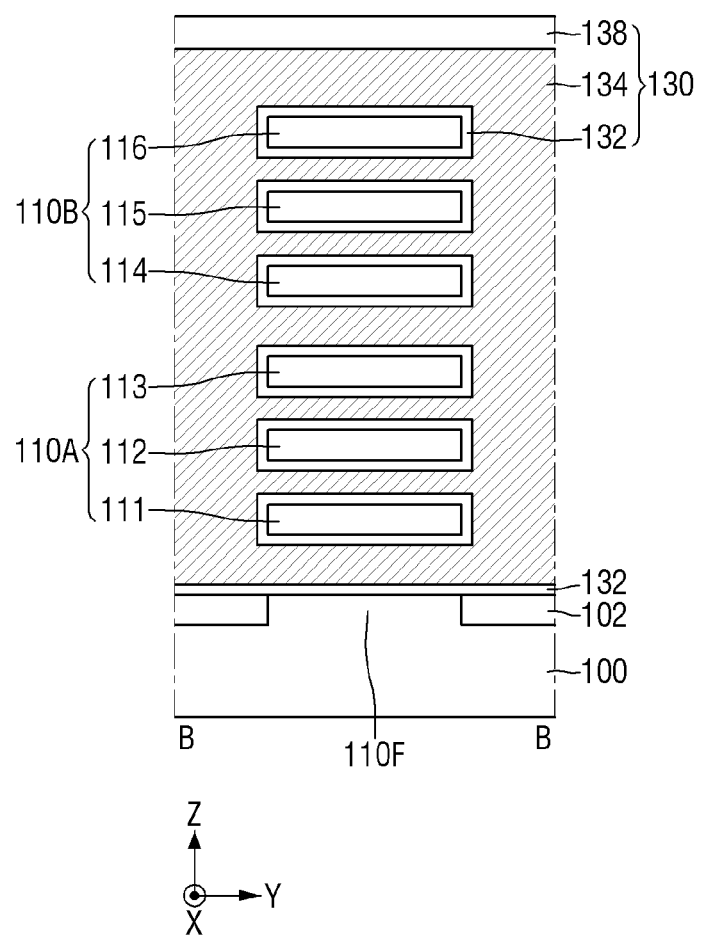
FIG. 3 is a cross-sectional view taken along line B-B of FIG. 1.
Figure 4:
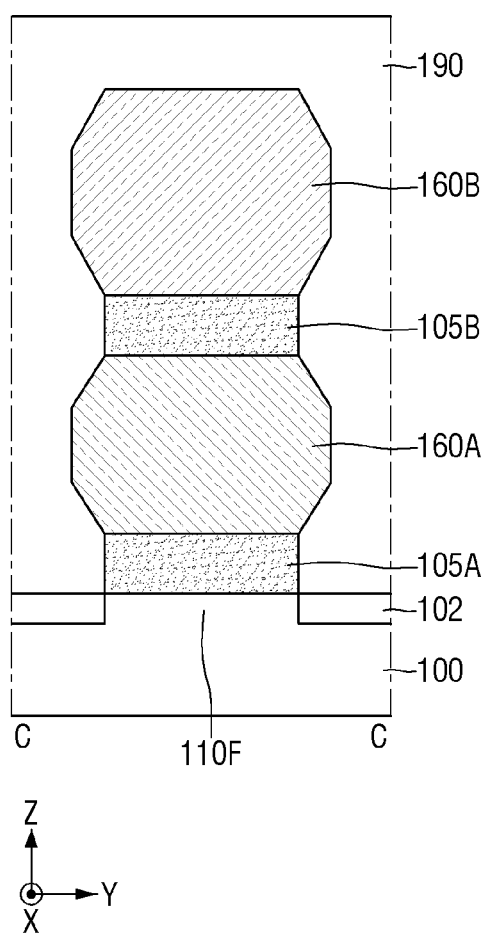
FIG. 4 is a cross-sectional view taken along line C-C of FIG. 1.
Figure 5:
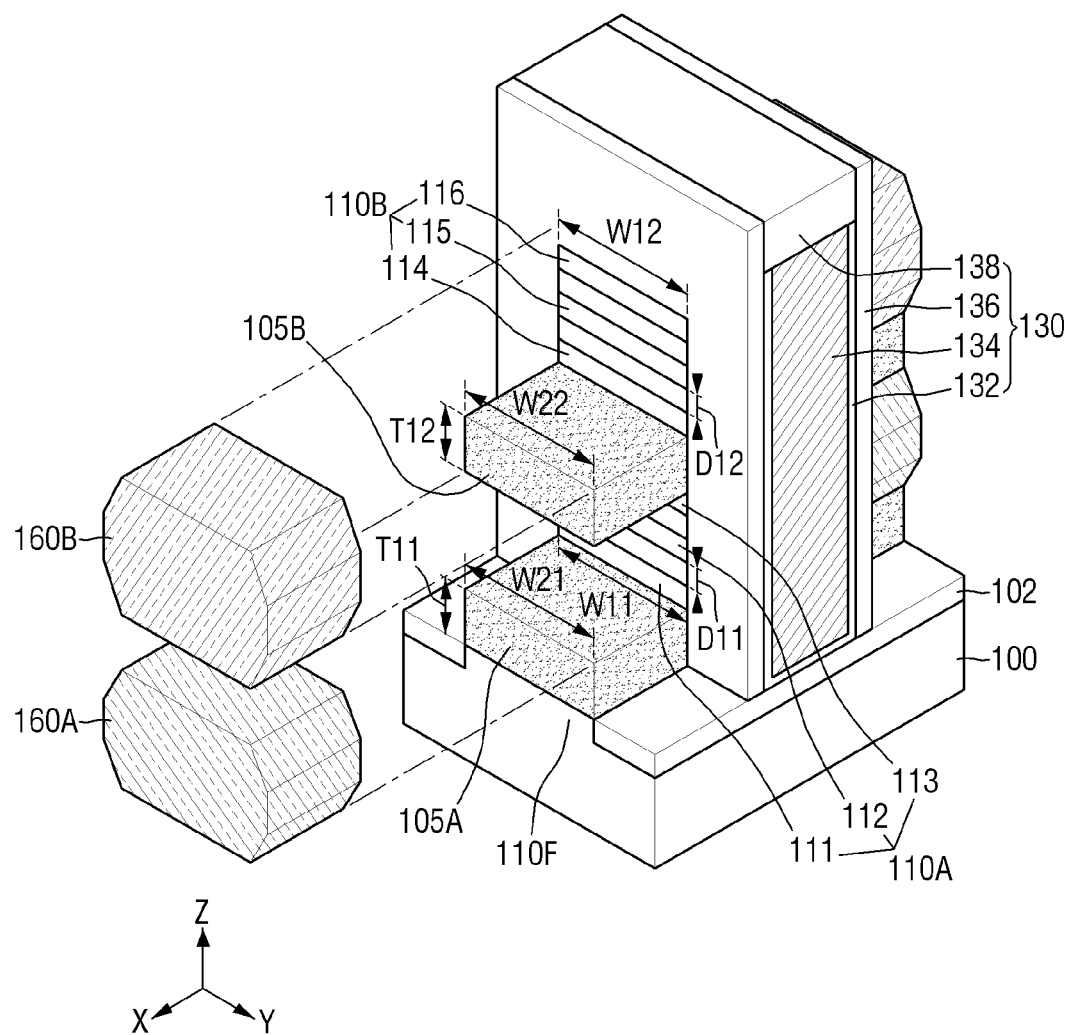
FIG. 5 is a partially exploded perspective view illustrating a semiconductor device according to some embodiments.

FIG. 1 is a perspective view illustrating a semiconductor device according to some embodiments. FIG. 2 is a cross-sectional view taken along line A-A of FIG. 1. FIG. 3 is a cross-sectional view taken along line B-B of FIG. 1. FIG. 4 is a cross-sectional view taken along line C-C of FIG. 1. FIG. 5 is a partially exploded perspective view illustrating a semiconductor device according to some embodiments.

Referring to FIGS. 1 to 5, a semiconductor device according to some embodiments includes a substrate 100, a first active pattern 110A, a second active pattern 110B, a gate structure 130, a first source/drain area 160A, a second source/drain area 160B, a first insulating structure 105A, a second insulating structure 105B, and an interlayer insulating layer 190. For convenience of description, the interlayer insulating layer 190 is omitted in FIGS. 1 and 5.

The substrate 100 may be a bulk silicon or a silicon-on-insulator (SOI). The substrate 100 may be a silicon substrate, or may include other material such as silicon germanium, silicon germanium on insulator (SGOI), indium antimonide, lead telluride compound, indium arsenide, indium phosphide, gallium arsenide or gallium antimonide. The substrate 100 may an epitaxial layer formed on a base substrate. For convenience of description, the following description will be based on that the substrate 100 is a silicon substrate.

The first active pattern 110A and the second active pattern 110B may sequentially be disposed on the substrate 100. The first active pattern 110A may be spaced apart from the substrate 100 on the substrate 100. The second active pattern 110B may be spaced apart from the first active pattern 110A on the first active pattern 110A. That is, the second active pattern 110B may be spaced apart from the substrate 100 to be farther away than the first active pattern 110A. Each of the first active pattern 110A and the second active pattern 110B may extend in a first direction X parallel with an upper surface of the substrate 100. The first active pattern 110A and the second active pattern 110B may overlap each other in a direction (e.g., third direction Z) crossing the upper surface of the substrate 100.

Each of the first active pattern 110A and the second active pattern 110B may include silicon (Si) or germanium (Ge), which are semiconductor material elements. Alternatively, each of the first active pattern 110A and the second active pattern 110B may include a compound semiconductor, for example, a group IV-IV compound semiconductor or a group III-V compound semiconductor. The group IV-IV compound semiconductor may be a binary compound or ternary compound, which includes at least two or more of carbon (C), silicon (Si), germanium (Ge) or tin (Sn), or a compound including at least two or more of carbon (C), silicon (Si), germanium (Ge) or tin (Sn), which are doped with a group IV element. The group III-V compound semiconductor may be, for example, one of a binary compound, a ternary compound or a quaternary compound, which is formed by combination of at least one of aluminum (Al), gallium (Ga) or indium (In), which is a group III element, and at least one of phosphorus (P), arsenic (As) or antimony (Sb), which is a group V element. For convenience of description, the following description will be based on that each of the first active pattern 110A and the second active pattern 110B is a silicon pattern.

In some embodiments, the first active pattern 110A may include a plurality of lower sheet patterns (e.g., first to third sheet patterns 111 to 113) that are sequentially disposed on the substrate 100 and spaced apart from one another. The first to third sheet patterns 111 to 113 may be spaced apart from the substrate 100.

In some embodiments, the second active pattern 110B may include a plurality of upper sheet patterns (e.g., fourth to sixth sheet patterns 114 to 116) that are sequentially disposed on the first active pattern 110A and spaced apart from one another. The fourth to sixth sheet patterns 114 to 116 may be spaced apart from the substrate 100 to be farther away than the first to third sheet patterns 111 to 113.

In some embodiments, a fin pattern 110F may be formed between the substrate 100 and the first active pattern 110A. The fin pattern 110F may protrude from the upper surface of the substrate 100 and extend in the first direction X. The fin pattern 110F may be formed by etching a portion of the substrate 100, and may be an epitaxial layer grown from the substrate 100. In some other embodiments, the fin pattern 110F may be omitted.

In some embodiments, a field insulating layer 102 may be formed on the substrate 100. The field insulating layer 102 may cover at least a portion of a side of the fin pattern 110F. As shown, an upper surface of the field insulating layer 102 may be coplanar with an upper surface of the fin pattern 110F. However, this is only exemplary, and as another example, an upper portion of the fin pattern 110F may protrude from an upper surface of the field insulating layer 102. The field insulating layer 102 may include, but is not limited to, at least one of silicon oxide, silicon nitride, silicon oxynitride or their combination. In some other embodiments, the field insulating layer 102 may be omitted.

The gate structure 130 may be formed on the substrate 100 and the field insulating layer 102. The gate structure 130 may cross the first active pattern 110A and the second active pattern 110B. For example, the gate structure 130 may extend in a second direction Y that is parallel with the upper surface of the substrate 100 and crosses the first direction X. Each of the first active pattern 110A and the second active pattern 110B may extend in the first direction X to pass through the gate structure 130. That is, the gate structure 130 may surround a side of the first active pattern 110A and a side of the second active pattern 110B.

In some embodiments, the gate structure 130 may include a gate dielectric layer 132, a gate electrode 134, a gate spacer 136, and a gate capping pattern 138.

The gate electrode 134 may be formed on the substrate 100 and the field insulating layer 102. The gate electrode 134 may extend in the second direction Y to cross the first active pattern 110A and the second active pattern 110B.

The gate electrode 134 may include, but is not limited to, at least one of TiN, WN, TaN, Ru, TiC, TaC, Ti, Ag, Al, TiAl, TiAlN, TiAlC, TaCN, TaSiN, Mn, Zr, W, Al or their combination. The gate electrode 134 may be formed through a replacement process, but is not limited thereto. Although the gate electrode 134 is shown as a single layer, this is only an example, and the gate electrode 134 may be formed by depositing a plurality of conductive layers. For example, the gate electrode 134 may include a work function control layer for adjusting a work function and a filling conductive layer for filling a space formed by the work function control layer. The work function control layer may include, for example, at least one of TiN, TaN, TiC, TaC, TiAlC or their combination. The filling conductive layer may include, for example, W or Al.

The gate dielectric layer 132 may be interposed between the first active pattern 110A and the gate electrode 134 and between the second active pattern 110B and the gate electrode 134. The gate dielectric layer 132 may also be interposed between a fin pattern 110F and the gate electrode 134 and between the field insulating layer 102 and the gate electrode 134.

The gate dielectric layer 132 may include at least one of silicon oxide, silicon oxynitride, silicon nitride or a high dielectric constant material having a dielectric constant greater than that of silicon oxide. The high dielectric constant material may include, but is not limited to, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate or their combination.

An interfacial layer may be formed between the first active pattern 110A and the gate dielectric layer 132 and between the second active pattern 110B and the gate dielectric layer 132. The interfacial layer may include, but is not limited to, a silicon oxide layer.

The semiconductor device according to some embodiments may include a negative capacitance (NC) FET based on a negative capacitor. For example, the gate dielectric layer 132 may include a ferroelectric material layer having ferroelectric characteristics, and a paraelectric material layer having paraelectric characteristics.

The gate spacer 136 may be formed on the substrate 100 and the field insulating layer 102. The gate spacer 136 may extend along a side of the gate electrode 134. In some embodiments, the gate dielectric layer 132 may be interposed between the gate electrode 134 and the gate spacer 136. For example, the gate dielectric layer 132 may further extend along an inner side of the gate spacer 136. The gate dielectric layer 132 may be formed through a replacement process, but is not limited thereto.

The gate spacer 136 may include, but is not limited to, at least one of silicon nitride, silicon oxynitride, silicon oxycarbide, silicon boron nitride, silicon boron carbonitride, silicon oxycarbonitride or their combination.

The gate capping pattern 138 may cover at least a portion of an upper surface of the gate electrode 134. For example, the gate capping pattern 138 may extend along the upper surface of the gate electrode 134. As shown, an upper surface of the gate spacer 136 may be coplanar with an upper surface of the gate capping pattern 138. However, this is only an example, and as another example, the gate capping pattern 138 may be formed to cover the upper surface of the gate spacer 136.

The gate capping pattern 138 may include, but is not limited to, at least one of silicon nitride, silicon oxynitride, silicon oxycarbide, silicon boron nitride, silicon boron carbonitride, silicon oxycarbonitride or their combination.

The first source/drain area 160A may be formed on the upper surface of the substrate 100 and at least one side (e.g., both sides along the first direction X) of the gate structure 130. The first source/drain area 160A may be connected with the first active pattern 110A. For example, each of the first to third sheet patterns 111 to 113 may be connected with the first source/drain area 160A by passing through the gate structure 130. The first source/drain area 160A may be electrically separated from the gate electrode 134 by the gate dielectric layer 132 and/or the gate spacer 136.

The second source/drain area 160B may be formed on an upper surface of the first source/drain area 160A and at least one side (e.g., both sides along the first direction X) of the gate structure 130. The second source/drain area 160B may be connected with the second active pattern 110B. For example, each of the fourth to sixth sheet patterns 114 to 116 may be connected with the second source/drain area 160B by passing through the gate structure 130. The second source/drain area 160B may be electrically separated from the gate electrode 134 by the gate dielectric layer 132 and/or the gate spacer 136.

Each of the first source/drain area 160A and the second source/drain area 160B may include an epitaxial layer. For example, each of the first source/drain area 160A and the second source/drain area 160B may be formed by an epitaxial growth method. In FIGS. 1 and 4, each of a cross-section of the first source/drain area 160A and a cross-section of the second source/drain area 160B is shown to be an octagonal shape. This is only an example. For another example, the cross-section of the first source/drain area 160A or the second source/drain area 160B may have various shapes such as a hexagonal shape and a diamond shape.

In some embodiments, the first source/drain area 160A and the second source/drain area 160B may have conductivity types different from each other. For example, the first source/drain area 160A may have a first conductivity type, and the second source/drain area 160B may have a second conductivity type different from the first conductivity type. For example, the first conductivity type may be a p-type, and the second conductivity type may be an n-type. In this case, the first active pattern 110A may be used as a channel area of a PFET, and the second active pattern 110B may be used as a channel area of an NFET. However, this is only an example, and the first conductivity type may be an n-type and the second conductivity type may be a p-type.

When an element formed by the first active pattern 110A or the second active pattern 110B is a p-type (e.g., PFET), the first source/drain area 160A or the second source/drain area 160B may include p-type impurities or impurities for preventing diffusion of the p-type impurities. For example, the first source/drain area 160A or the second source/drain area 160B may include at least one of B, C, In, Ga, Al or their combination.

In some embodiments, when the element formed by the first active pattern 110A or the second active pattern 110B is a p-type (e.g., PFET), the first source/drain area 160A or the second source/drain area 160B may include a compressive stress material. For example, when the first active pattern 110A or the second active pattern 110B is a silicon pattern, the first source/drain area 160A or the second source/drain area 160B may include a material (e.g., silicon germanium (SiGe)) having a lattice constant greater than that of silicon (Si). The compressive stress material may apply compressive stress to the first active pattern 110A or the second active pattern 110B to improve carrier mobility of the channel area.

When the element formed by the first active pattern 110A or the second active pattern 110B is an n-type (e.g., NFET), the first source/drain area 160A or the second source/drain area 160B may include n-type impurities or impurities for preventing diffusion of the n-type impurities. For example, the first source/drain area 160A or the second source/drain area 160B may include at least one of P, Sb, As or their combination.

In some embodiments, when the element formed by the first active pattern 110A or the second active pattern 110B is an n-type (e.g., NFET), the first source/drain area 160A or the second source/drain area 160B may include a tensile stress material. For example, when the first active pattern 110A or the second active pattern 110B is a silicon pattern, the first source/drain area 160A or the second source/drain area 160B may include a material (e.g., silicon carbide (SiC)) having a lattice constant less than that of silicon (Si). The tensile stress material may apply tensile stress to the first active pattern 110A or the second active pattern 110B to improve carrier mobility of the channel area.

The first insulating structure 105A may be formed on at least one side (e.g., both sides along the first direction X) of the gate structure 130. The first insulating structure 105A may be interposed between the substrate 100 and the first source/drain area 160A. The first insulating structure 105A may electrically separate the substrate 100 from the first source/drain area 160A.

The first insulating structure 105A may not be interposed between the substrate 100 and the first active pattern 110A. For example, the first insulating structure 105A may not be interposed between the substrate 100 and the gate structure 130 and between the gate structure 130 and the first active pattern 110A (e.g., first sheet pattern 111). That is, the two first insulating structures 105A respectively disposed on both sides, along the first direction X, of the gate structure 130 may be separated from each other by the gate structure 130. In some embodiments, a lower surface of the first insulating structure 105A may be coplanar with a lowest surface of the gate structure 130.

The second insulating structure 105B may be formed on at least one side (e.g., both sides along the first direction X) of the gate structure 130. The second insulating structure 105B may be interposed between the first source/drain area 160A and the second source/drain area 160B. The second insulating structure 105B may electrically separate the first source/drain area 160A from the second source/drain area 160B.

The second insulating structure 105B may not be interposed between the first active pattern 110A and the second active pattern 110B. For example, the second insulating structure 105B may not be interposed between the first active pattern 110A (e.g., third sheet pattern 113) and the gate structure 130 and between the gate structure 130 and the second active pattern 110B (e.g., fourth sheet pattern 114). That is, the two second insulating structures 105B respectively disposed on both sides, along the first direction X, of the gate structure 130 may be separated from each other by the gate structure 130. In some embodiments, a lower surface of the second insulating structure 105B may be coplanar with an uppermost surface of the first active pattern 110A.

A first thickness T11 of the first insulating structure 105A and a second thickness T12 of the second insulating structure 105B may be greater than a first distance (e.g., distance D11 between the first sheet pattern 111 and the second sheet pattern 112) where the lower sheet patterns (e.g., first to third sheet patterns 111 to 113) are spaced apart from one another and a second distance (e.g., distance D12 between the fourth sheet pattern 114 and the fifth sheet pattern 115) where the upper sheet patterns (e.g., fourth to sixth sheet patterns 114 to 116) are spaced apart from one another. In this case, the thickness refers to the thickness in the third direction Z. For example, the first thickness T11 may be about 1.5 times of the first distance D11, and the second thickness T12 may be about 1.5 times of the second distance D12. Preferably, the first thickness T11 may be about twice of the first distance D11, and the second thickness T12 may be about twice of the second distance D12.

As shown, the first thickness T11 and the second thickness T12 may be the same as each other, and the first distance D11 and the second distance D12 may be the same as each other. However, this is only an example. As another example, the first thickness T11 and the second thickness T12 may be different from each other, and the first distance D11 and the second distance D12 may be different from each other.

In some embodiments, the first thickness T11 of the first insulating structure 105A may be the same as a third distance (e.g., distance D21 between the substrate 100 and the first sheet pattern 111) between the substrate 100 and the first active pattern 110A. In some embodiments, the second thickness T12 of the second insulating structure 105B may be the same as a fourth distance (e.g., distance D22 between the third sheet pattern 113 and the fourth sheet pattern 114) between the first active pattern 110A and the second active pattern 110B. In the present disclosure, the term "same" is meant to include a fine difference that may occur due to a process margin or the like, as well as completely identical.

In some embodiments, a width W21 of the first insulating structure 105A and a width W22 of the second insulating structure 105B may be the same as a width W11 of the first active pattern 110A and a width W12 of the second active pattern 110B. In this case, the width means a width in the second direction Y.

Each of the first insulating structure 105A and the second insulating structure 105B may include, but is not limited to, at least one of silicon nitride, silicon oxynitride, silicon oxycarbide, silicon boron nitride, silicon boron carbonitride, silicon oxycarbonitride or their combination. In some embodiments, a dielectric constant of the first insulating structure 105A and a dielectric constant of the second insulating structure 105B may be about 7 or less, respectively. For example, each of the first insulating structure 105A and the second insulating structure 105B may include a silicon carbonitride layer.

In some embodiments, the first insulating structure 105A and the second insulating structure 105B may be formed at the same level. In the present disclosure, the term "same level" means that corresponding elements are formed by the same fabricating process. For example, the first insulating structure 105A and the second insulating structure 105B may be formed simultaneously by the same fabricating process to have the same material composition. This will be described in more detail with reference to FIGS. 12 to 24.

The interlayer insulating layer 190 may be formed on the substrate 100 and the field insulating layer 102. The interlayer insulating layer 190 may be formed to fill a space on an outer side of the gate spacer 136. For example, the interlayer insulating layer 190 may cover the first source/drain area 160A, the second source/drain area 160B, the first insulating structure 105A and the second insulating structure 105B. Although the interlayer insulating layer 190 is shown to expose an upper surface of the gate structure 130, this is only an example, and the interlayer insulating layer 190 may cover the upper surface of the gate structure 130.

The interlayer insulating layer 190 may include at least one of silicon oxide, silicon nitride, silicon oxynitride, silicon oxycarbide, silicon boron nitride, silicon boron carbonitride, silicon oxycarbonitride or a low dielectric constant material. The low dielectric constant material may include, for example, Flowable Oxide (FOX), Torene SilaZene (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), Parylene, bis-benzocyclobutenes (BCB), SiLK, polyimide, porous polymeric material or their combination, but is not limited thereto.

In a multi-gate transistor based on a three-dimensional channel such as a sheet pattern (or wire pattern), an insulating structure may be used to separate the substrate from the source/drain area or separate source/drain areas, which are deposited, from each other. However, an insulating structure which passes through the gate structure forms a leakage path, whereby a problem occurs in that performance of the semiconductor device is degraded. For example, due to diffusion of the material (e.g., lanthanum (La) or aluminum (Al)) constituting the gate structure, the insulating structure in the form of passing through the gate structure may form a leakage path on a surface adjacent to the gate structure.

However, the semiconductor device according to some embodiments may include the first insulating structure 105A and the second insulating structure 105B, which are separated by the gate structure 130 respectively, thereby having improved performance. For example, as described above, the first insulating structure 105A may not be interposed between the substrate 100 and the first active pattern 110A, and the second insulating structure 105B may not be interposed between the first active pattern 110A and the second active pattern 110B. As a result, a semiconductor device with improved performance may be provided.

Also, as described below in the description of FIGS. 12 to 24, the first insulating structure 105A and the second insulating structure 105B may be formed at the same level. As a result, a semiconductor device with performance improved by a simplified process may be provided.

Figure 6:
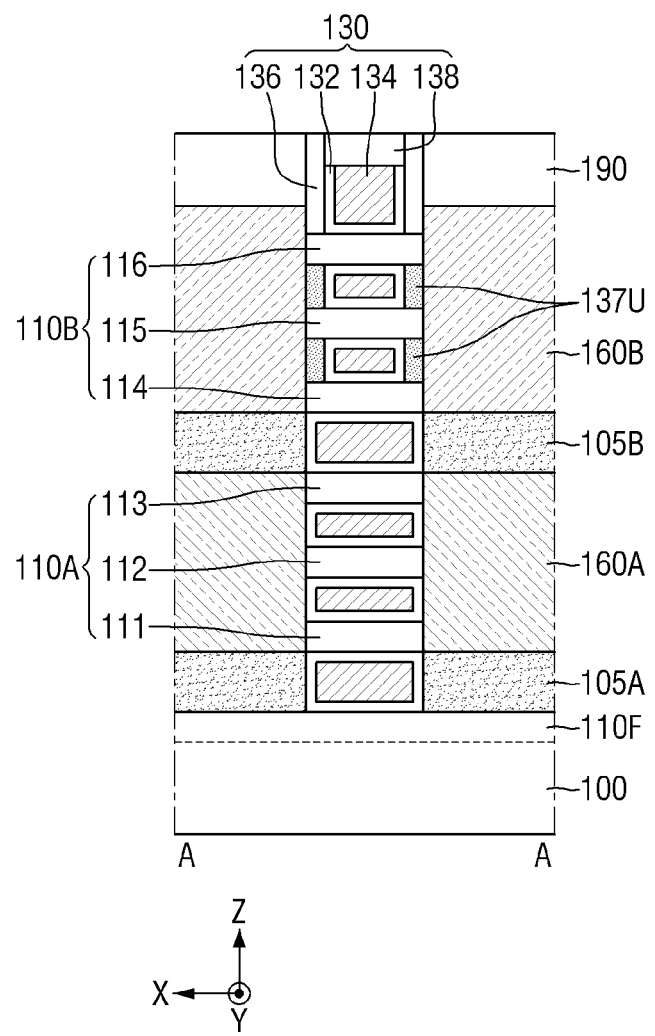
FIGS. 6 and 7 are various cross-sectional views illustrating a semiconductor device according to some embodiments.
Figure 7:
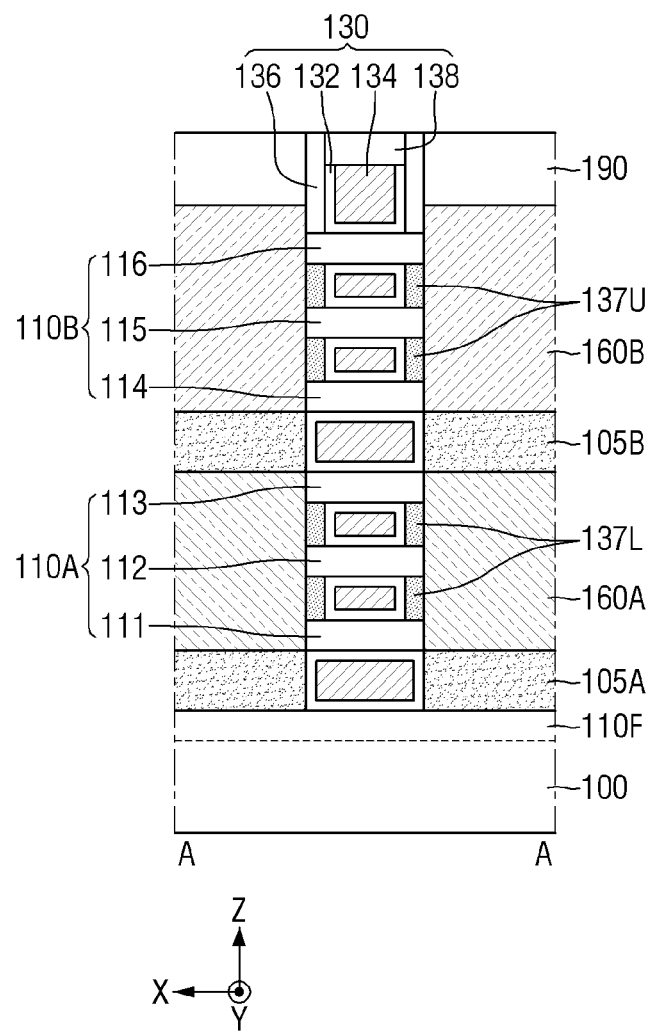

FIGS. 6 and 7 are various cross-sectional views illustrating a semiconductor device according to some embodiments. For convenience of description, portions duplicated with those described with reference to FIGS. 1 to 5 will be described briefly or omitted.

Referring to FIG. 6, the semiconductor device according to some embodiments further includes an upper inner spacer 137U.

The upper inner spacer 137U may be formed among the upper sheet patterns (e.g., fourth to sixth sheet patterns 114 to 116). Also, the upper inner spacer 137U may be interposed between the gate electrode 134 and the second source/drain area 160B. The upper inner spacer 137U may electrically separate the gate electrode 134 from the second source/drain area 160B.

The upper inner spacer 137U may include, but is not limited to, at least one of silicon nitride, silicon oxynitride, silicon oxycarbide, silicon boron nitride, silicon boron carbonitride, silicon oxycarbonitride or their combination. The upper inner spacer 137U may include the same material as that of the gate spacer 136, or may include a material different from that of the gate spacer 136. For example, a dielectric constant of the upper inner spacer 137U may be greater than that of the gate spacer 136.

In some embodiments, the element formed by the first active pattern 110A may be a p-type (e.g., PFET), and the element formed by the second active pattern 110B may be an n-type (e.g., NFET).

Referring to FIG. 7, the semiconductor device according to some embodiments further includes a lower inner spacer 137L and an upper inner spacer 137U.

The lower inner spacer 137L may be formed among the lower sheet patterns (e.g., first to third sheet patterns 111 to 113). The lower inner spacer 137L may be interposed between the gate electrode 134 and the first source/drain area 160A. The lower inner spacer 137L may electrically separate the gate electrode 134 from the first source/drain area 160A.

The lower inner spacer 137L may include, but is not limited to, at least one of silicon nitride, silicon oxynitride, silicon oxycarbide, silicon boron nitride, silicon boron carbonitride, silicon oxycarbonitride or their combination. The lower inner spacer 137L may include the same material as that of the gate spacer 136, or may include a material different from that of the gate spacer 136. For example, a dielectric constant of the lower inner spacer 137L may be greater than that of the gate spacer 136.

Because the upper inner spacer 137U is similar to that described with reference to FIG. 6, its detailed description will be omitted.

In some embodiments, the element formed by the first active pattern 110A may have a first conductivity type, and the element formed by the second active pattern 110B may have a second conductivity type different from the first conductivity type. For example, the first conductivity type may be a p-type, and the second conductivity type may be an n-type. For another example, the first conductivity type may be an n-type, and the second conductivity type may be a p-type.

Figure 8:
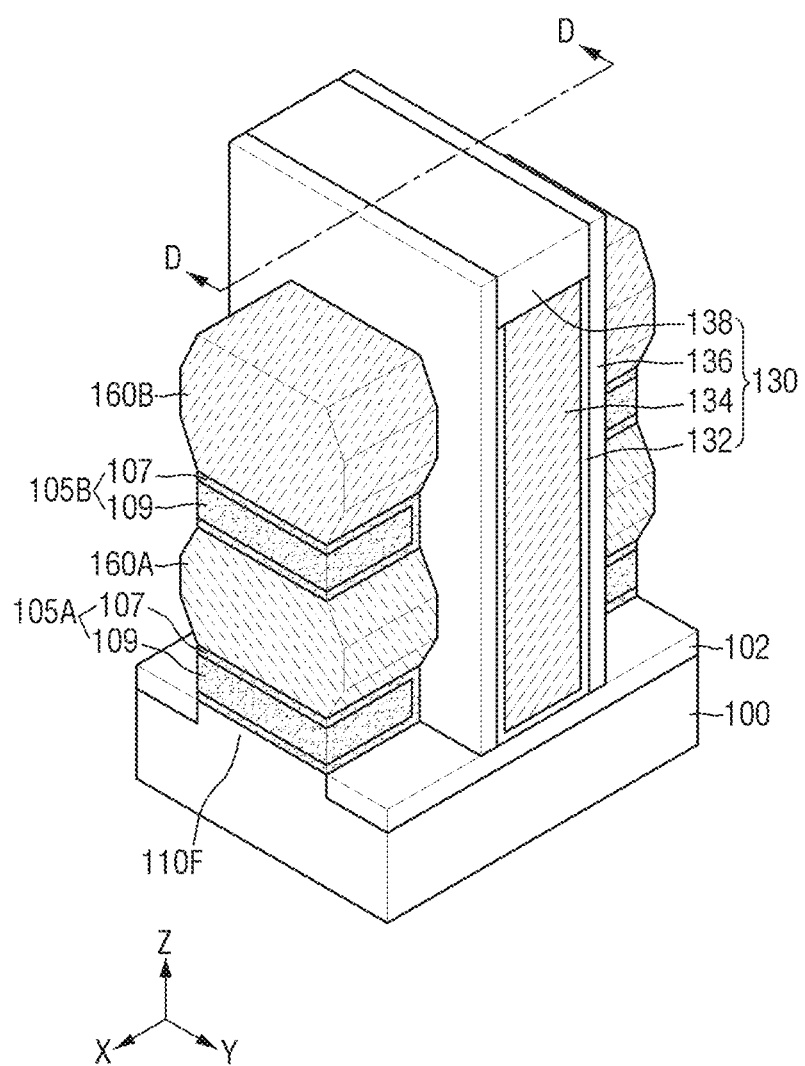
FIG. 8 is a perspective view illustrating a semiconductor device according to some embodiments.
Figure 9:
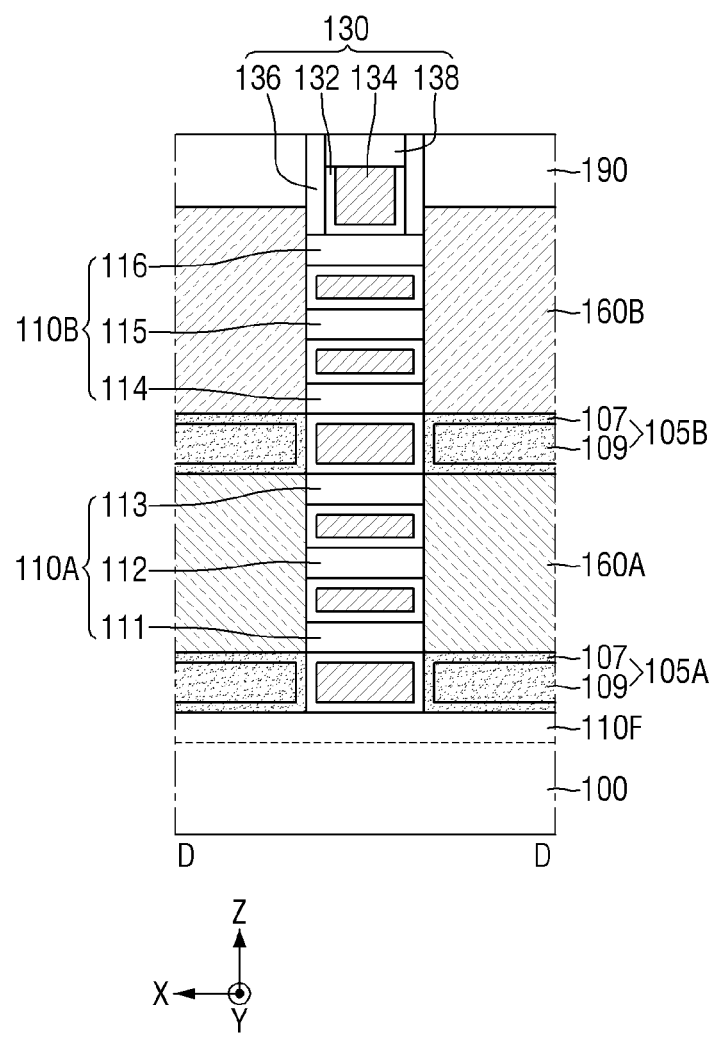
FIG. 9 is a cross-sectional view taken along line D-D of FIG. 8.

FIG. 8 is a perspective view illustrating a semiconductor device according to some embodiments. FIG. 9 is a cross-sectional view taken along line D-D of FIG. 8. For convenience of description, portions duplicated with those described with reference to FIGS. 1 to 5 will be described briefly or omitted.

Referring to FIGS. 8 and 9, in the semiconductor device according to some embodiments, each of the first insulating structure 105A and the second insulating structure 105B includes a plurality of insulating layers (e.g., first isolation insulating layer 107 and second isolation insulating layer 109).

The first isolation insulating layer 107 and the second isolation insulating layer 109 may be sequentially deposited. For example, the first isolation insulating layer 107 of the first insulating structure 105A may conformally extend along an upper surface of the fin pattern 110F, a side of the gate structure 130 and a lower surface of the first source/drain area 160A. The second isolation insulating layer 109 of the first insulating structure 105A may be formed on the first isolation insulating layer 107 to fill a space between the fin pattern 110F and the first source/drain area 160A. For example, the first isolation insulating layer 107 of the second insulating structure 105B may conformally extend along the upper surface of the first source/drain area 160A, the side of the gate structure 130 and a lower surface of the second source/drain area 160B. The second isolation insulating layer 109 of the second insulating structure 105B may be formed on the first isolation insulating layer 107 to fill a space between the first source/drain area 160A and the second source/drain area 160B.

Each of the first isolation insulating layer 107 and the second isolation insulating layer 109 may include, but is not limited to, at least one of silicon nitride, silicon oxynitride, silicon oxycarbide, silicon boron nitride, silicon boron carbonitride, silicon oxycarbonitride or their combination. In some embodiments, a dielectric constant of the first isolation insulating layer 107 and a dielectric constant of the second isolation insulating layer 109 may be about 7 or less, respectively. For example, each of the first isolation insulating layer 107 and the second isolation insulating layer 109 may include a silicon carbonitride layer.

In some embodiments, the first isolation insulating layer 107 and the second isolation insulating layer 109 may include materials different from each other. For example, the dielectric constant of the second isolation insulating layer 109 may be lower than that of the first isolation insulating layer 107. For example, the first isolation insulating layer 107 may include a first silicon carbonitride layer, and the second isolation insulating layer 109 may include a second silicon carbonitride layer having a carbon ratio higher than that of the first isolation insulating layer 107.

In some other embodiments, the second isolation insulating layer 109 may be omitted. For example, each of the first insulating structure 105A and the second insulating structure 105B may include a void. For example, insulating layers of which step coverage is not good may be deposited to form the first separation insulating layer 107 including a void.

Figure 10:
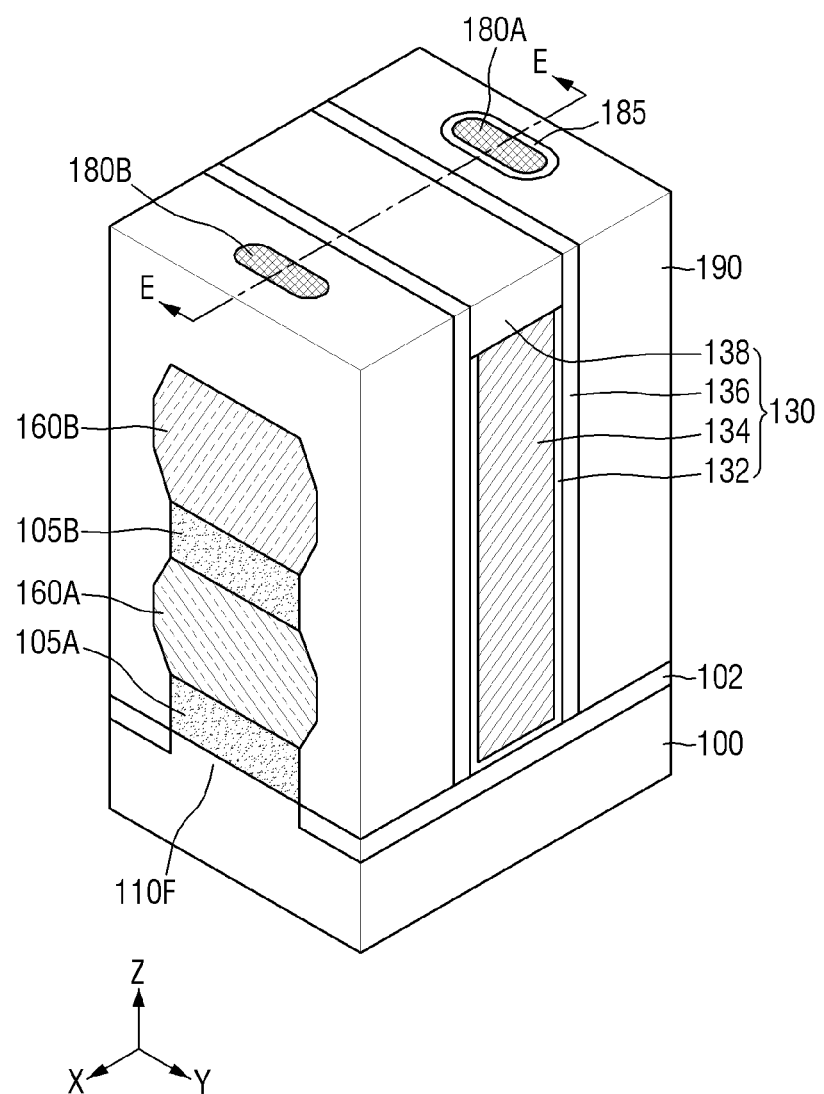
FIG. 10 is a perspective view illustrating a semiconductor device according to some embodiments.
Figure 11:
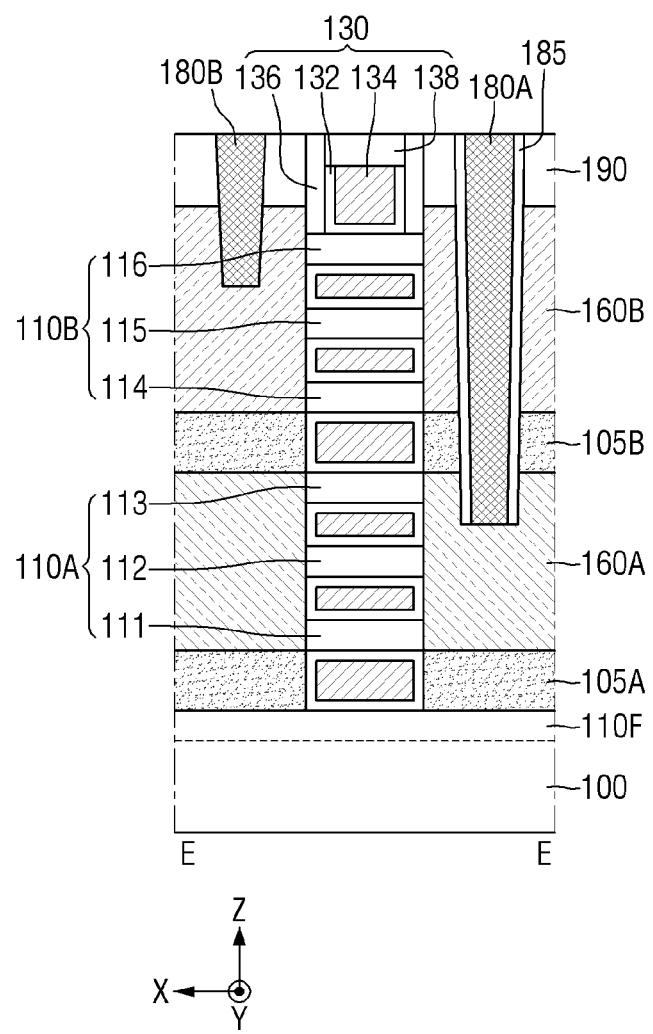
FIG. 11 is a cross-sectional view taken along line E-E of FIG. 10.

FIG. 10 is a perspective view illustrating a semiconductor device according to some embodiments. FIG. 11 is a cross-sectional view taken along line E-E of FIG. 10. For convenience of description, portions duplicated with those described with reference to FIGS. 1 to 5 will be described briefly or omitted.

Referring to FIGS. 10 and 11, a semiconductor device according to some embodiments further includes a first source/drain contact 180A and a second source/drain contact 180B.

The first source/drain contact 180A may be connected with the first source/drain area 160A. For example, the first source/drain contact 180A may extend in the third direction Z to pass through the interlayer insulating layer 190, the second source/drain area 160B and the second insulating structure 105B, and may be in contact with the first source/drain area 160A. For example, the first source/drain contact 180A may extend through a portion of the first source/drain area 160A.

In some embodiments, a contact spacer 185, which extends along the side of the first source/drain area 160A, may be formed. The contact spacer 185 may electrically separate the first source/drain contact 180A from the second source/drain area 160B. As a result, the first source/drain contact 180A may be connected only to the first source/drain area 160A, and may not be connected to (i.e., insulated from) the second source/drain area 160B. The contact spacer 185 may include, but is not limited to, at least one of silicon oxide, silicon nitride, silicon oxynitride or their combination.

In some other embodiments, the contact spacer 185 may be omitted. In this case, the first source/drain contact 180A may be connected with both the first source/drain area 160A and the second source/drain area 160B. That is, the first source/drain contact 180A may serve as a shared source/drain contact.

The second source/drain contact 180B may be connected with the second source/drain area 160B. For example, the second source/drain contact 180B may extend in the third direction Z to pass through the interlayer insulating layer 190, and may be in contact with the second source/drain area 160B. For example, the second source/drain contact 180B may extend through a portion of the second source/drain area 160B.

Hereinafter, a method for fabricating a semiconductor device according to exemplary embodiments will be described with reference to FIGS. 1 to 30.

FIGS. 12 to 24 are views of intermediate operations of a method for fabricating a semiconductor device according to some embodiments. For convenience of description, portions duplicated with those described with reference to FIGS. 1 to 11 will be described briefly or omitted.

Figure 12:
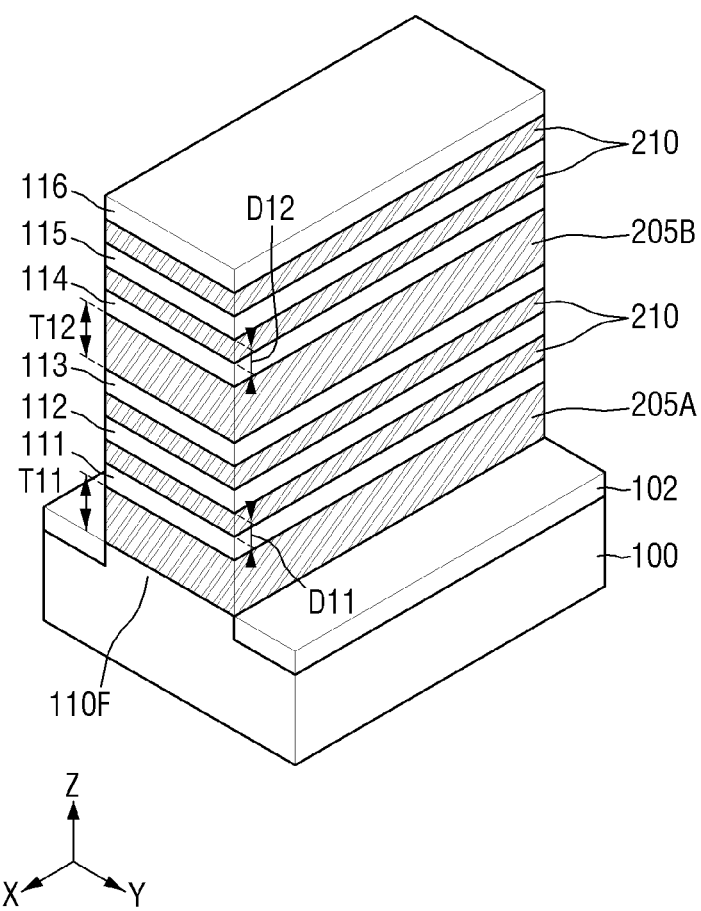
FIGS. 12 to 24 are views of intermediate operations of a method for fabricating a semiconductor device according to some embodiments.

Referring to FIG. 12, a plurality of sheet patterns 111 to 116 and a plurality of sacrificial patterns 205A, 205B and 210 are formed on the substrate 100.

For example, a first material layer and a second material layer, which are alternately deposited, may be formed on the substrate 100. A mask pattern extending in the first direction X may be formed on the first material layer and the second material layer. Subsequently, a patterning process for patterning the first material layer and the second material layer may be performed using the mask pattern as an etching mask.

The patterned second material layer may form the sheet patterns 111 to 116. The patterned first material layer may form the sacrificial patterns 205A, 205B and 210. For example, the first material layer interposed between the substrate 100 and the first sheet pattern 111 may form the first sacrificial pattern 205A. The first material layer interposed between the third sheet pattern 113 and the fourth sheet pattern 114 may form the second sacrificial pattern 205B. The first material layer interposed among the first to third sheet patterns 111 to 113 and among the fourth to sixth sheet patterns 114 to 116 may form the plurality of third sacrificial patterns 210.

In some embodiments, the sheet patterns 111 to 116 and the sacrificial patterns 205A, 205B and 210 may have etching selection ratios different from one another. For example, the sheet patterns 111 to 116 may include silicon germanium (SiGe), and the sacrificial patterns 205A, 205B and 210 may include silicon (Si).

In some embodiments, a first thickness T11 of the first sacrificial pattern 205A and a second thickness T12 of the second sacrificial pattern 205B may be greater than thicknesses D11 and D12 of the third sacrificial patterns 210. For example, the first thickness T11 of the first sacrificial pattern 205A and the second thickness T12 of the second sacrificial pattern 205B may be about 1.5 times of the thickness D11 or D12 of each of the third sacrificial patterns 210.

In some embodiments, during the process of patterning the first material layer and the second material layer, a portion of the substrate 100 may be etched to form the fin pattern 110F. Subsequently, the field insulating layer 102 may be formed on the substrate 100. The field insulating layer 102 may cover at least a portion of the side of the fin pattern 110F.

Figure 13:
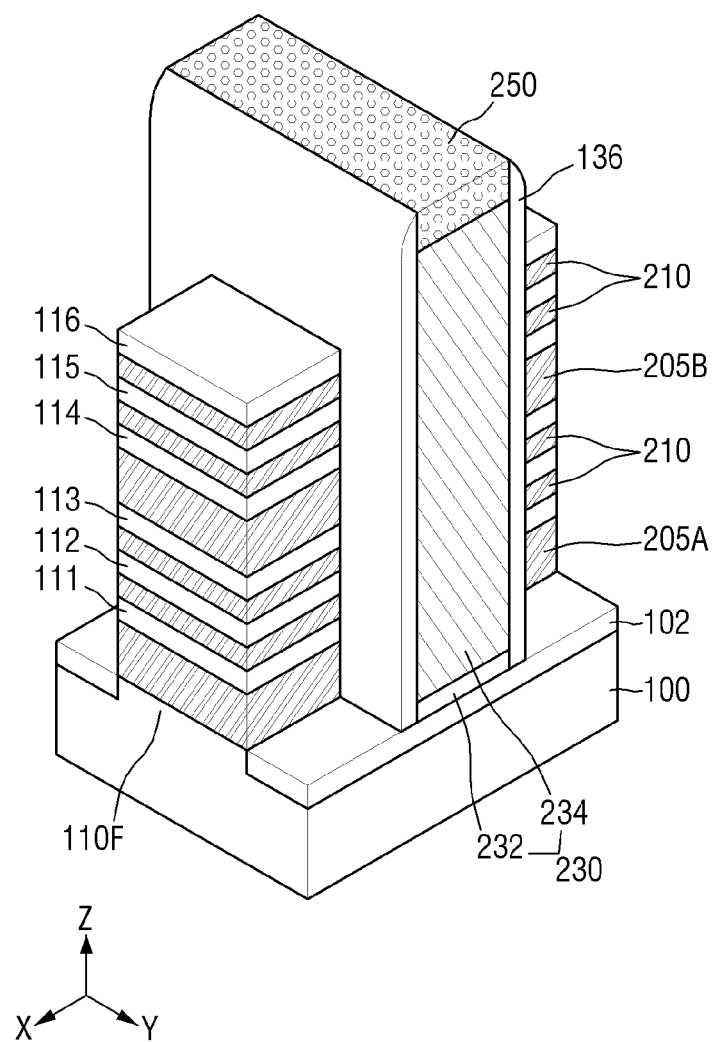

Referring to FIG. 13, a dummy gate structure 230 and a gate spacer 136 are formed on the substrate 100.

The dummy gate structure 230 may be formed on the substrate 100 and the field insulating layer 102. The dummy gate structure 230 may cross the sheet patterns 111 to 116 and the sacrificial patterns 205A, 205B and 210. For example, the dummy gate structure 230 may extend in the second direction Y. The sheet patterns 111 to 116 and the sacrificial patterns 205A, 205B and 210B may respectively extend in the first direction X to pass through the dummy gate structure 230.

The dummy gate structure 230 may include a dummy gate dielectric layer 232 and a dummy gate electrode 234, which are sequentially deposited on the substrate 100 and the field insulating layer 102. The dummy gate dielectric layer 232 and the dummy gate electrode 234 may be formed by a patterning process using a mask pattern 250 as an etching mask. For example, a dielectric layer and an electrode layer, which are sequentially deposited on the substrate 100 and the field insulating layer 102, may be formed. Subsequently, the mask pattern 250 extending in the second direction Y may be formed on the electrode layer. Subsequently, a patterning process for patterning the dielectric layer and the electrode layer may be performed using the mask pattern 250 as an etching mask. The patterned dielectric layer may form the dummy gate dielectric layer 232, and the patterned electrode layer may form the dummy gate electrode 234.

The dummy gate electrode 234 may include a material having an etching selection ratio different from that of each of the sheet patterns 111 to 116 and the sacrificial patterns 205A, 205B and 210. For example, the dummy gate electrode 234 may include polysilicon (poly Si).

The gate spacer 136 may be formed on the substrate 100 and the field insulating layer 102. The gate spacer 136 may extend along a side of the dummy gate structure 230. In some embodiments, the gate spacer 136 may extend along a side of the mask pattern 250.

Figure 14:
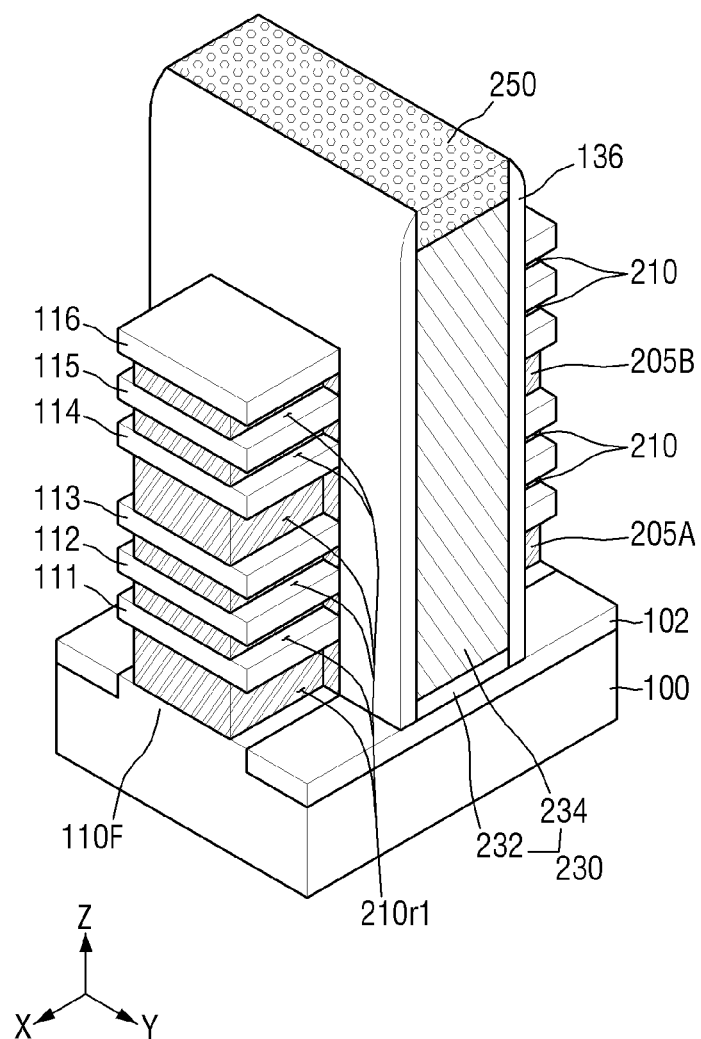

Referring to FIG. 14, a first recess process is performed for the sacrificial patterns 205A, 205B and 210.

As the first recess process is performed, each side of the sacrificial patterns 205A, 205B and 210B may be recessed to form a first recess 210r1. As the first recess 210r1 is formed, the sheet patterns 111 to 116 may extend past the side of each of the sacrificial patterns 205A, 205B and 210 in the second direction Y.

Although the sacrificial patterns 205A, 205B and 210 disposed inside the gate spacer 136 and the dummy gate structure 230 are shown as not being recessed at all, this is only for convenience of description. Depending on the characteristics of the first recess process, at least a portion of the sacrificial patterns 205A, 205B and 210 disposed in the gate spacer 136 may be recessed, or a portion of the sacrificial patterns 205A, 205B and 210 disposed inside the dummy gate structure 230 may be recessed.

Figure 15:
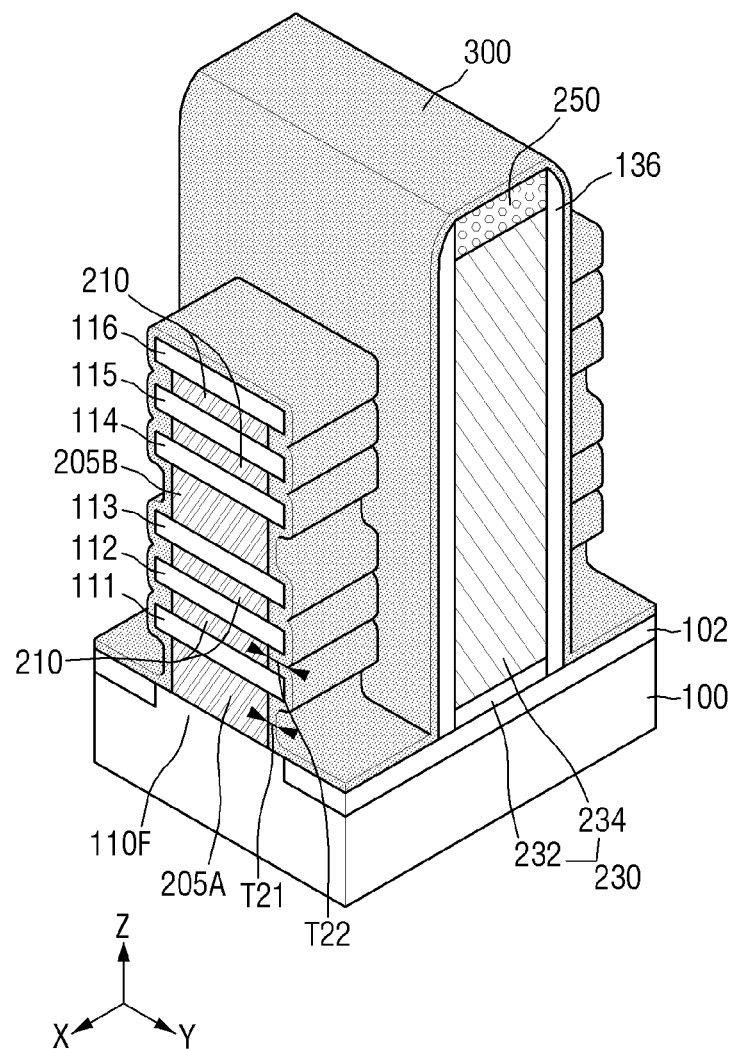

Referring to FIG. 15, a spacer layer 300 is formed.

For example, the spacer layer 300 may formed to conformally extend along a surface of the result of FIG. 14. The spacer layer 300 may be formed to fill at least a portion of the first recess 210r1 of FIG. 14. For example, the spacer layer 300 may extend to be conformal along the sides of the sheet patterns 111 to 116 and the sides of the sacrificial patterns 205A, 205B and 210.

A third thickness T21 of the spacer layer 300 formed on the side of the first sacrificial pattern 205A and the side of the second sacrificial pattern 205B may be less than a fourth thickness T22 of the spacer layer 300 formed on the side of each of the third sacrificial patterns 210. For example, as described above with respect to FIG. 12, the thicknesses D11 and D12 of the third sacrificial patterns 210 may be formed to be relatively thin. In this case, the spacer layer 300 extended along the side of each of the third sacrificial patterns 210 may be formed to be relatively thick due to a folding phenomenon. Alternatively, the first thickness T11 of the first sacrificial pattern 205A and the second thickness T12 of the second sacrificial pattern 205B may be formed to be relatively thick. Therefore, the spacer layer 300 extended along the side of the first sacrificial pattern 205A and the side of the second sacrificial pattern 205B may extend to be conformal in a relatively wide space and then formed to be relatively thin.

The spacer layer 300 may include, but is not limited to, at least one of silicon nitride, silicon oxynitride, silicon oxycarbide, silicon boron nitride, silicon boron carbonitride, silicon oxycarbonitride or their combination.

Figure 16:
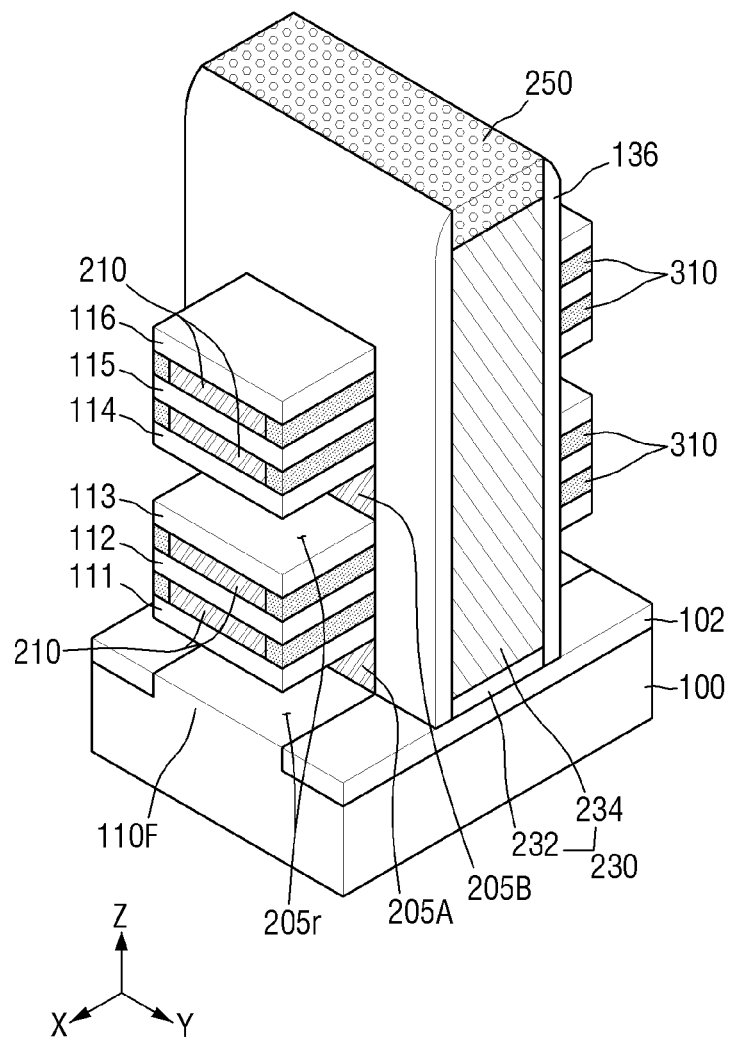

Referring to FIG. 16, a second recess process is performed for the first sacrificial pattern 205A and the second sacrificial pattern 205B.

As the second recess process is performed, a portion of the first sacrificial pattern 205A and a portion of the second sacrificial pattern 205B, which are disposed outside the dummy gate structure 230, may be removed. Therefore, a second recess 205r may be formed between the substrate 100 and the first sheet pattern 111 outside the dummy gate structure 230, and between the third sheet pattern 113 and the fourth sheet pattern 114 outside the dummy gate structure 230.

Although the first sacrificial pattern 205A and the second sacrificial pattern 205B disposed inside the gate spacer 136 and the dummy gate structure 230 are shown as not being recessed at all, this is only for convenience of description. Depending on the characteristics of the second recess process, at least a portion of the first sacrificial pattern 205A and at least a portion of the second sacrificial pattern 205B, which are disposed in the gate spacer 136, may be recessed, or a portion of the first sacrificial pattern 205A and a portion of the second sacrificial pattern 205B, which are disposed in the dummy gate structure 230, may be recessed.

In the second recess process, the third sacrificial patterns 210 may not be recessed. For example, as described above with respect to FIG. 15, a thickness T22 of the spacer layer 300 formed on the side of each of the third sacrificial patterns 210 may be relatively thicker than the thickness T21 of the spacer layer 300 formed on the side of the first sacrificial pattern 205A and the side of the second sacrificial pattern 205B. Therefore, as shown in FIG. 16, during the second recess process, a portion of the spacer layer 300 extended along the sides of the sheet patterns 111 to 116, the side of the first sacrificial pattern 205A and the side of the second sacrificial pattern 205B may be removed, and another portion of the spacer layer 300 extended along the sides of the third sacrificial patterns 210 may remain to form a protective spacer 310. The third sacrificial patterns 210 may be protected by the protective spacer 310, and thus may not be recessed.

Figure 17:
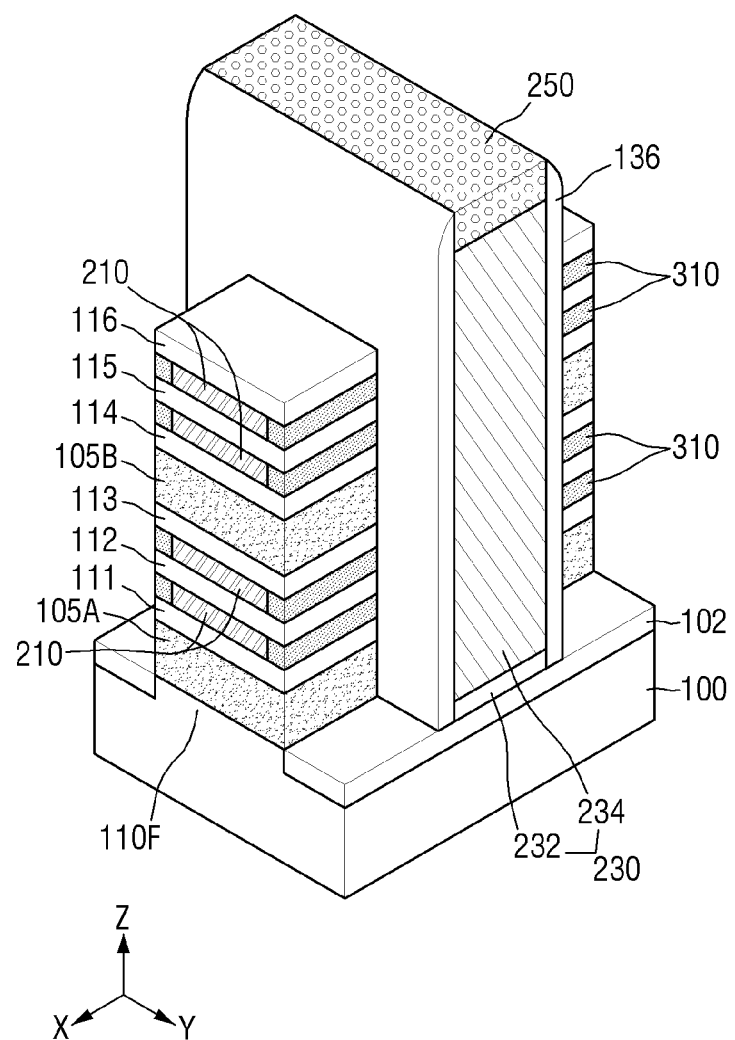

Referring to FIG. 17, the first insulating structure 105A and the second insulating structure 105B are formed on the side of the dummy gate structure 230.

The first insulating structure 105A may fill an area between the substrate 100 and the first sheet pattern 111, and the second insulating structure 105B may fill an area between the third sheet pattern 113 and the fourth sheet pattern 114. For example, an insulating layer may be formed to fill the second recess 205r of FIG. 16. Subsequently, a patterning process for patterning the insulating layer may be performed using the sixth sheet pattern 116 as an etching mask. The patterned insulating layer may form the first insulating structure 105A and the second insulating structure 105B.

Each of the first insulating structure 105A and the second insulating structure 105B may include, but is not limited to, at least one of silicon nitride, silicon oxynitride, silicon oxycarbide, silicon boron nitride, silicon boron carbonitride, silicon oxycarbonitride or their combination. In some embodiments, a dielectric constant of the first insulating structure 105A and a dielectric constant of the second insulating structure 105B may be about 7 or less, respectively. For example, each of the first insulating structure 105A and the second insulating structure 105B may include a silicon carbonitride layer.

Figure 18:
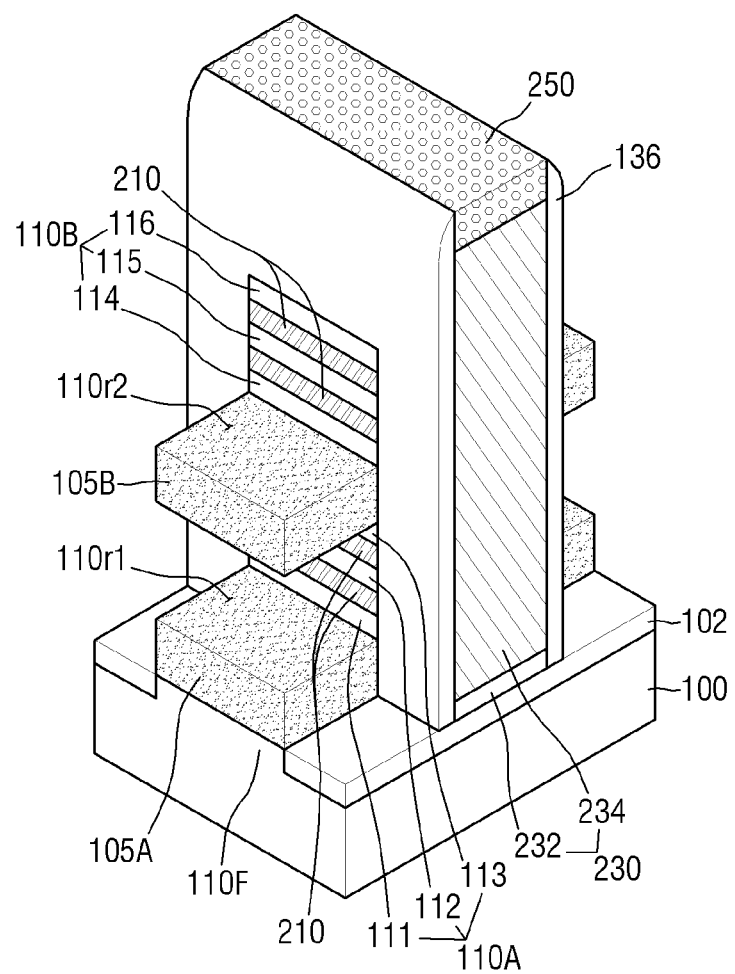

Referring to FIG. 18, a third recess process is performed for the sheet patterns 111 to 116 and the third sacrificial patterns 210.

As the third recess process is performed, a portion of each of the sheet patterns 111 to 116 and a portion of each of the third sacrificial patterns 210, which are disposed outside the dummy gate structure 230, may be removed. Therefore, a third recess 110r1 may be formed between the first insulating structure 105A and the second insulating structure 105B, and a fourth recess 110r2 may be formed on an upper surface of the second insulating structure 105B. Also, the first active pattern 110A including the lower sheet patterns (e.g., first to third sheet patterns 111 to 113) and the second active pattern 110B including the upper sheet patterns (e.g., fourth to sixth sheet patterns 114 to 116) may be formed. The third recess 110r1 may expose the first active pattern 110A, and the fourth recess 110r2 may expose the second active pattern 110B.

In some embodiments, the third sacrificial patterns 210 may not be recessed during the third recess process. For example, the third recess process may selectively recess the sheet patterns 111 to 116 by using an etching selection ratio between the sheet patterns 111 to 116 and the third sacrificial patterns 210.

Figure 19:
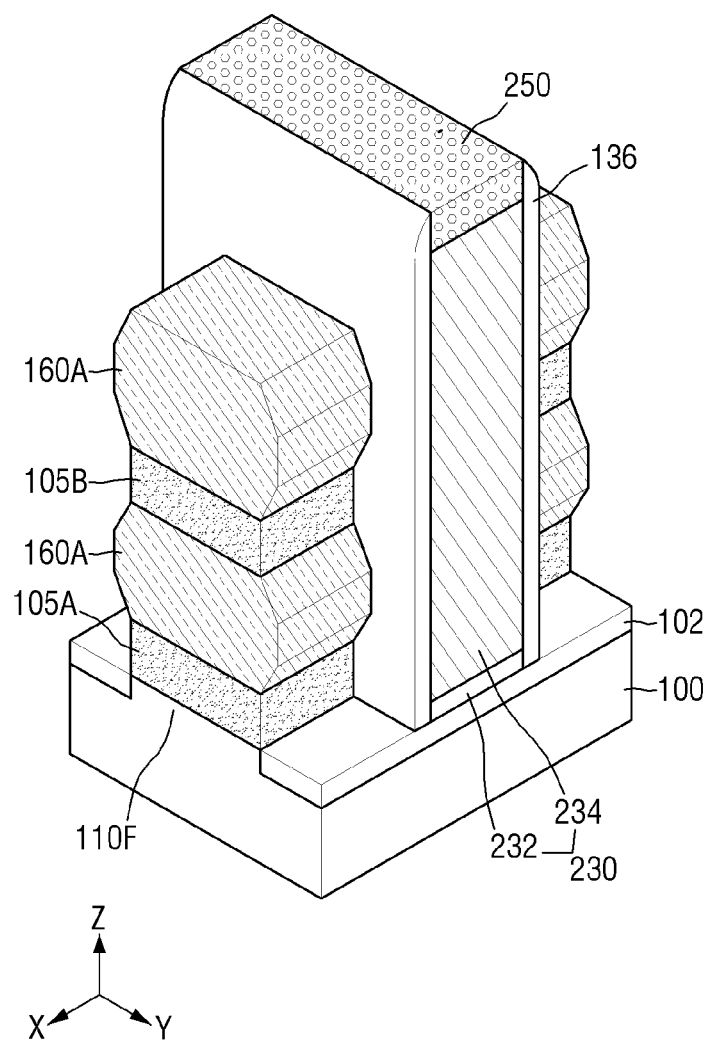

Referring to FIG. 19, the first source/drain area 160A is formed on the side of the dummy gate structure 230.

The first source/drain area 160A may be formed on an area between the first insulating structure 105A and the second insulating structure 105B, and on the upper surface of the second insulating structure 105B. For example, the first source/drain area 160A may fill the third recess 110r1 and the fourth recess 110r2 of FIG. 18. Therefore, the first source/drain area 160A connected with the first active pattern 110A and the second active pattern 110B may be formed. The first source/drain area 160A may be formed by, for example, an epitaxial growth method.

In some embodiments, the first source/drain area 160A may be formed by an epitaxial cladding growth process. For example, the third sacrificial patterns 210 may not be recessed during the third recess process, and the first source/drain areas 160A may be formed in an area between the third sacrificial patterns 210 by epitaxial cladding growth.

Figure 20:
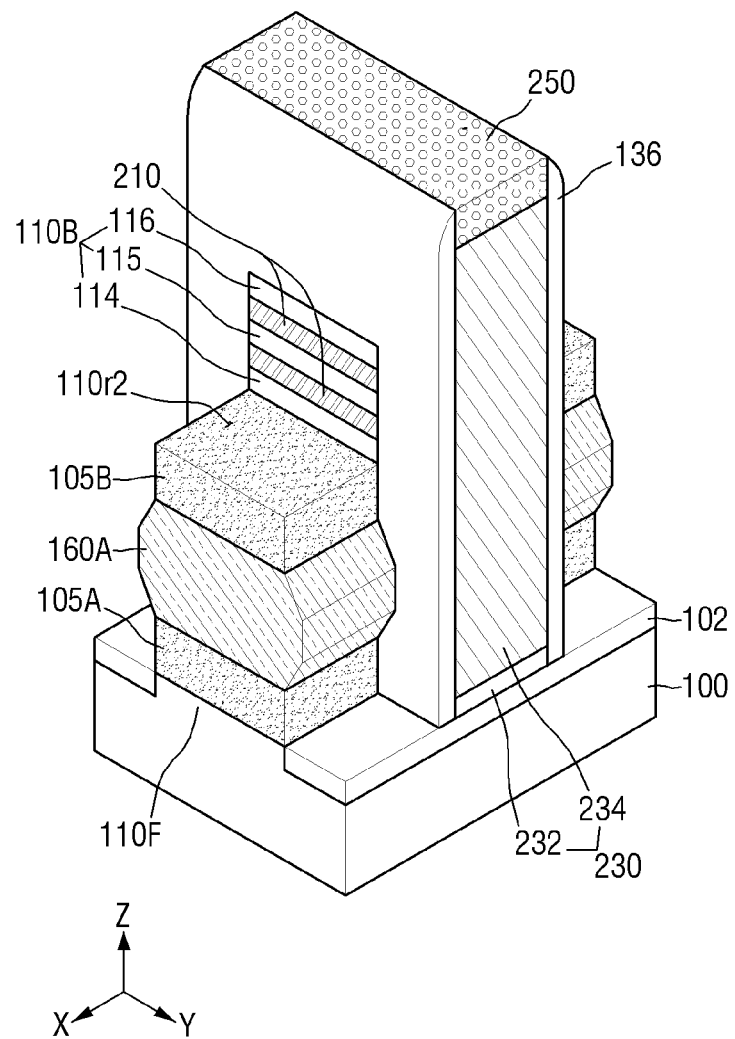

Referring to FIG. 20, the first source/drain area 160A on the upper surface of the second insulating structure 105B is removed.

For example, an etching process may be performed to remove the first source/drain area 160A on the upper surface of the second insulating structure 105B. The etching process may include, but is not limited to, a dry etching process. Therefore, the fourth recess 110r2 may be formed on the upper surface of the second insulating structure 105B. The fourth recess 110r2 may expose the second active pattern 110B.

Figure 21:
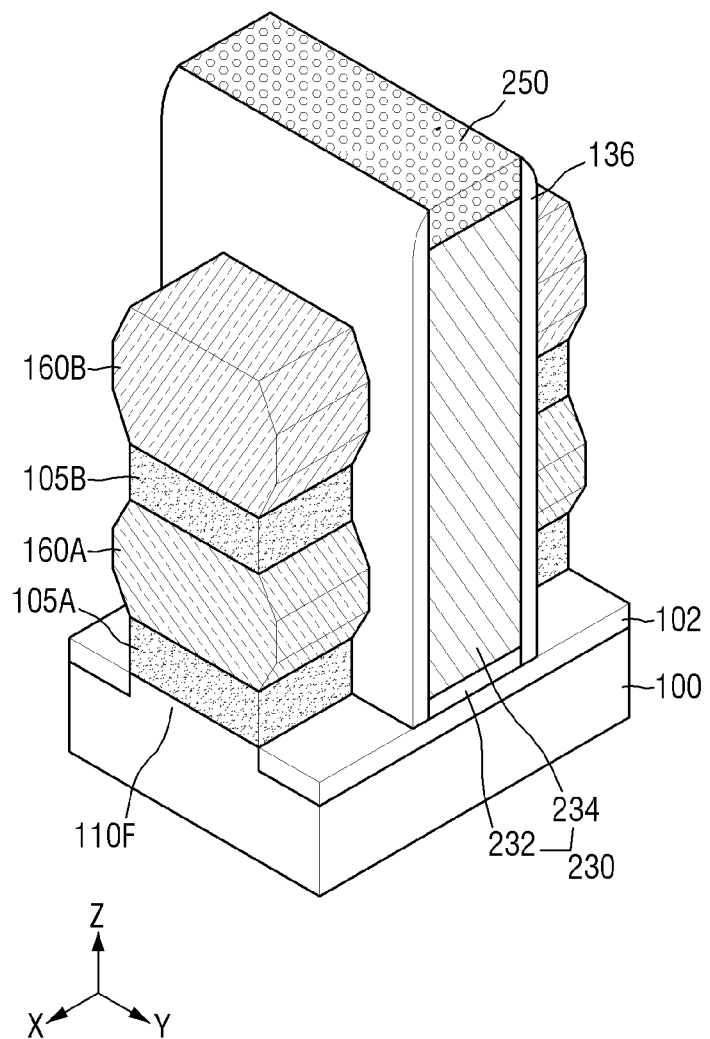

Referring to FIG. 21, the second source/drain area 160B is formed on the side of the dummy gate structure 230.

The second source/drain area 160B may be formed on the upper surface of the second insulating structure 105B. For example, the second source/drain area 160B may fill the fourth recess 110r2 of FIG. 20. Therefore, the second source/drain area 160B connected with the second active pattern 110B may be formed. The second source/drain area 160B may be formed by, for example, an epitaxial growth method.

Figure 22:
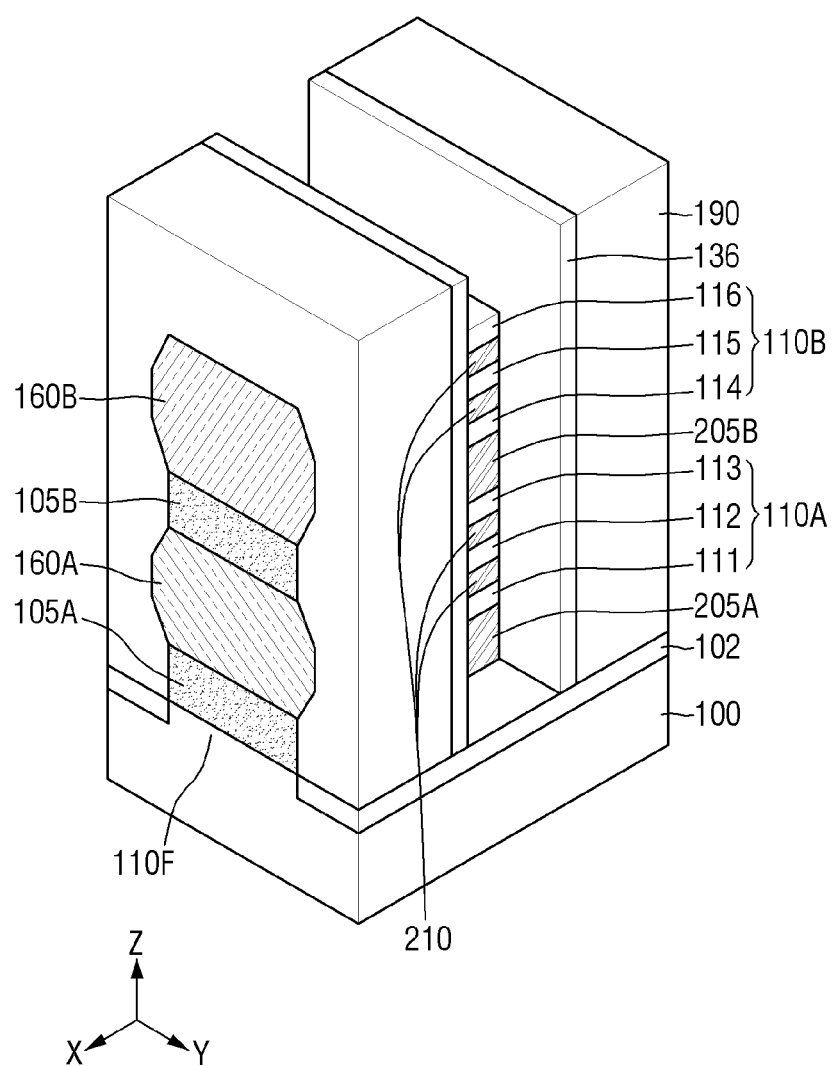

Referring to FIG. 22, the dummy gate structure 230 is removed.

For example, the interlayer insulating layer 190 may be formed on the substrate 100 and the field insulating layer 102. The interlayer insulating layer 190 may be formed to fill the space on the outer side of the gate spacer 136. For example, the interlayer insulating layer 190 may cover the first source/drain area 160A, the second source/drain area 160B, the first insulating structure 105A and the second insulating structure 105B.

Subsequently, the mask pattern 250 and the dummy gate structure 230, which are exposed by the interlayer insulating layer 190 and the gate spacer 136, may be removed. The dummy gate structure 230 may selectively be removed. As the dummy gate structure 230 is removed, the sheet patterns 111 to 116 and the sacrificial patterns 205A, 205B and 210 disposed inside the gate spacer 136 may be exposed.

Figure 23:
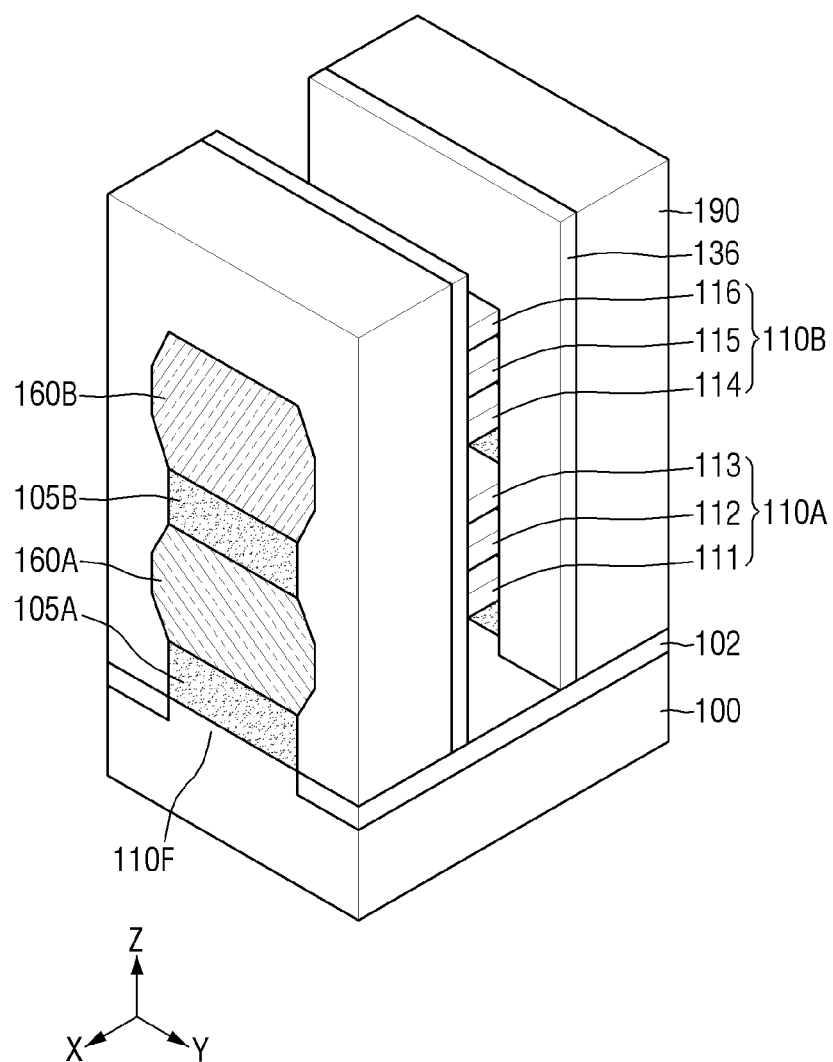

Referring to FIG. 23, the sacrificial patterns 205A, 205B and 210 are removed.

As described above, the sheet patterns 111 to 116 and the sacrificial patterns 205A, 205B and 210 may have etching selection ratios different from one another. Therefore, the sacrificial patterns 205A, 205B and 210 may selectively be removed. As the sacrificial patterns 205A, 205B and 210 are removed, the sheet patterns 111 to 116 spaced apart from one another may be formed.

Figure 24:
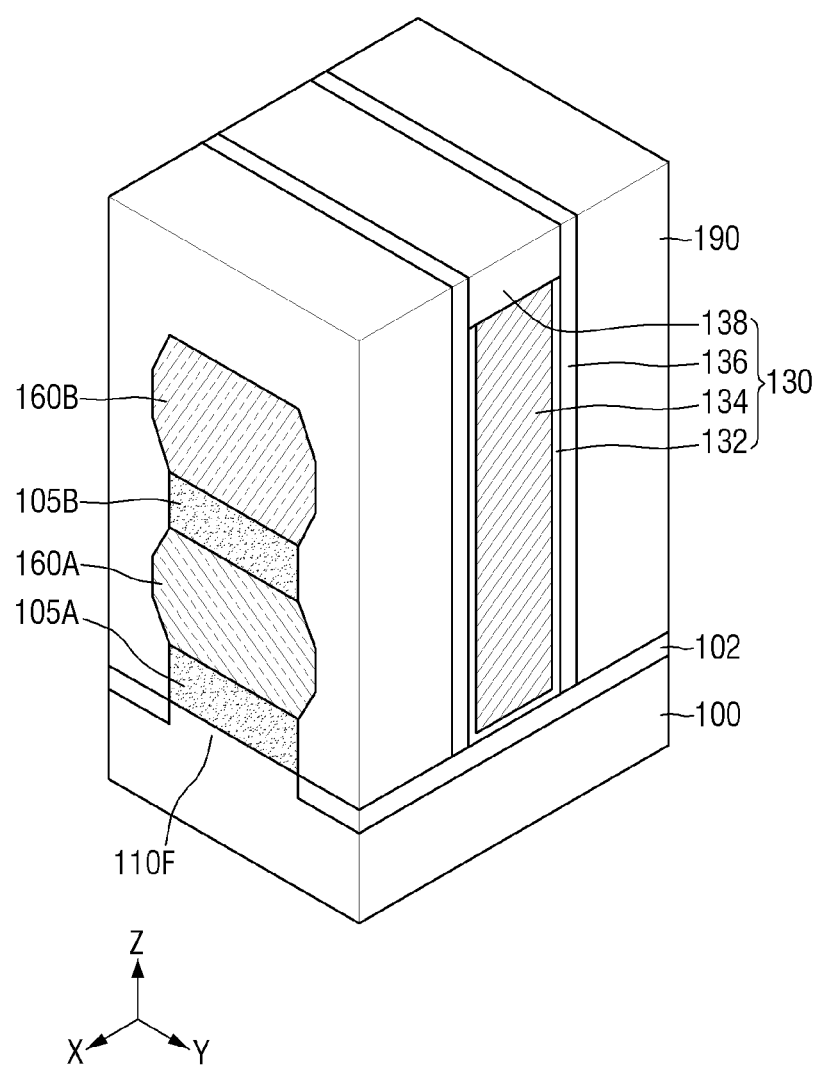

Referring to FIG. 24, the gate structure 130 is formed.

For example, the gate dielectric layer 132 may be formed to conformally extend along the surface of the result of FIG. 23. Subsequently, the gate electrode 134 may be formed on the gate dielectric layer 132. In some embodiments, the upper surface of the gate electrode 134 may be recessed. The gate capping pattern 138 may extend along the upper surface of the recessed gate electrode 134. Therefore, the gate structure 130, which includes the gate dielectric layer 132, the gate electrode 134, the gate spacer 136 and the gate capping pattern 138, may be formed.

Therefore, the semiconductor device described above may be fabricated using FIGS. 1 to 5. After the gate structure 130 is formed, the first source/drain contact 180A and the second source/drain contact 180B may be formed. Therefore, the semiconductor device described above may be fabricated using FIGS. 10 and 11.

Figure 25:
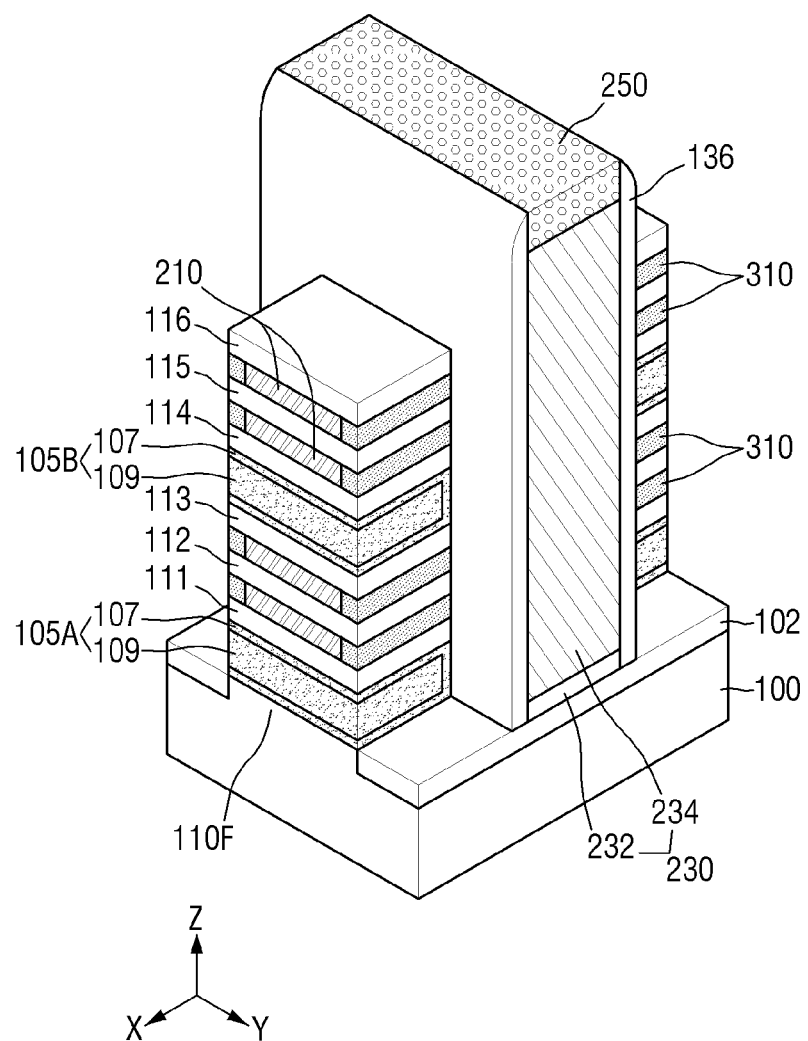
FIG. 25 is a view of an intermediate operation of a method for fabricating a semiconductor device according to some embodiments.

FIG. 25 is a view of an intermediate operation of a method for fabricating a semiconductor device according to some embodiments. For convenience of description, portions duplicated with those described with reference to FIGS. 1 to 24 will be described briefly or omitted. For reference, FIG. 25 is a view illustrating operations subsequent to FIG. 16.

Referring to FIG. 25, the first insulating structure 105A and the second insulating structure 105B, which include a plurality of insulating layers (e.g., a first isolation insulating layer 107 and a second isolation insulating layer 109), are formed on the side of the dummy gate structure 230.

For example, the first isolation insulating layer 107 conformally extending along the upper surface of the fin pattern 110F, the lower surface of the first sheet pattern 111, and the side of the gate structure 130 may be formed. Subsequently, the second isolation insulating layer 109 may be formed on the first isolation insulating layer 107. The second isolation insulating layer 109 may fill the space between the fin pattern 110F and the first sheet pattern 111 on both sides of the gate structure 130.

Subsequently, the above-described operations may be performed using operations corresponding to FIGS. 18 to 24. Therefore, the semiconductor device described above may be fabricated using FIGS. 8 and 9.

Figure 26:
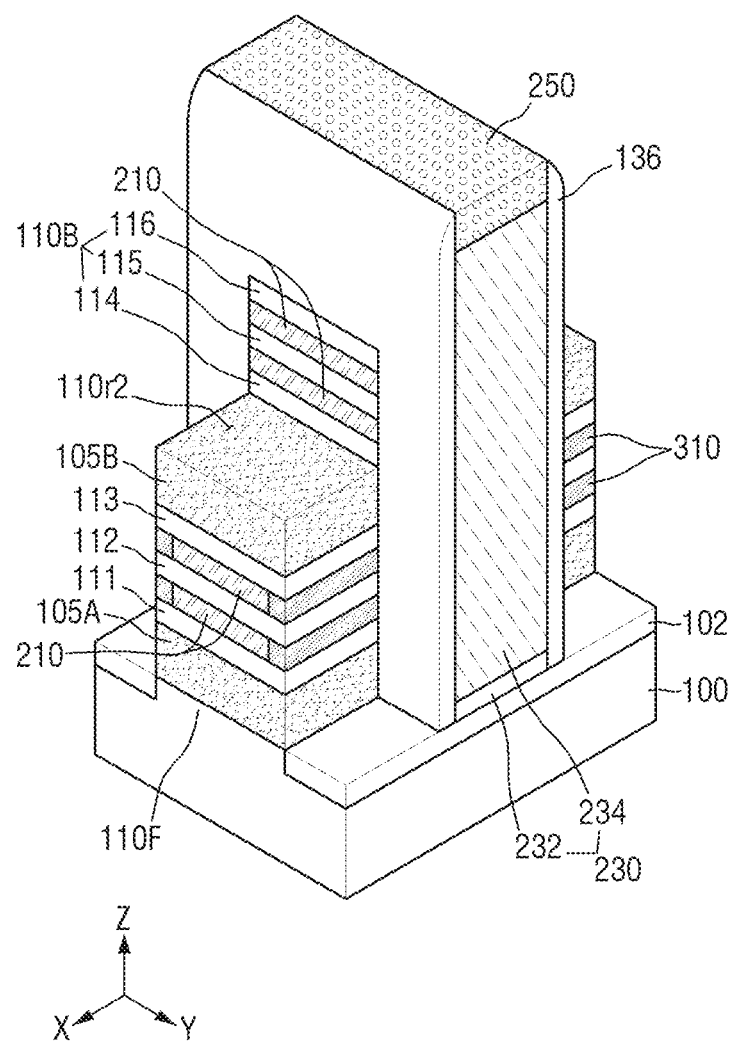
FIGS. 26 to 28 are views of intermediate operations of a method for fabricating a semiconductor device according to some embodiments.
Figure 27:
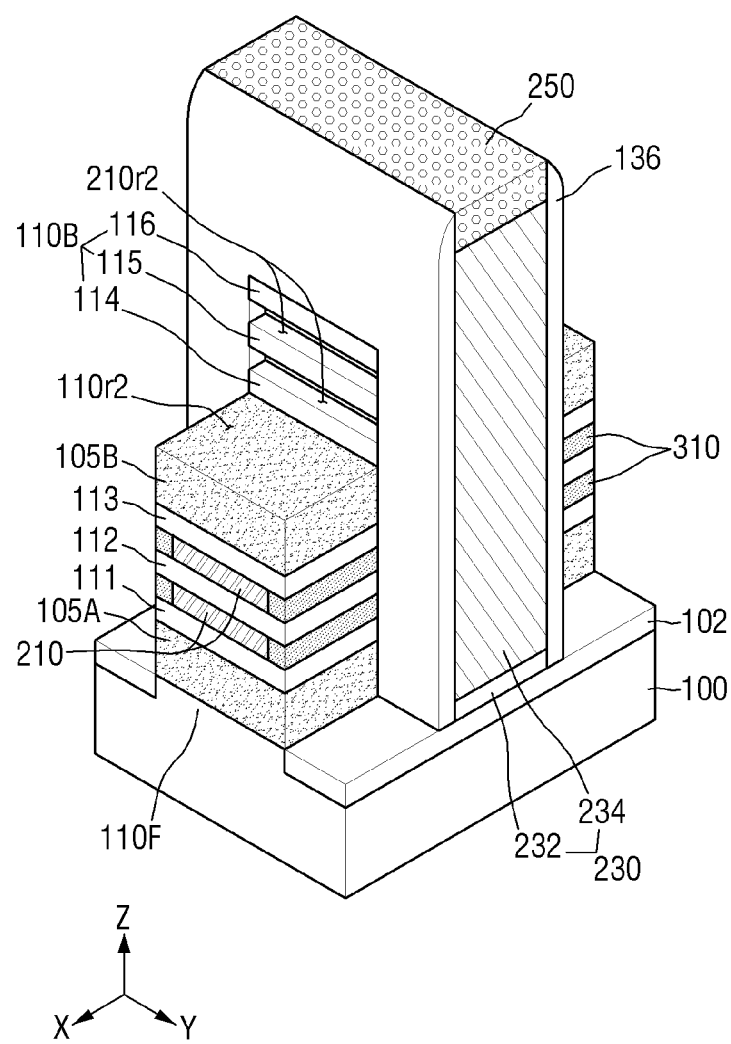
Figure 28:
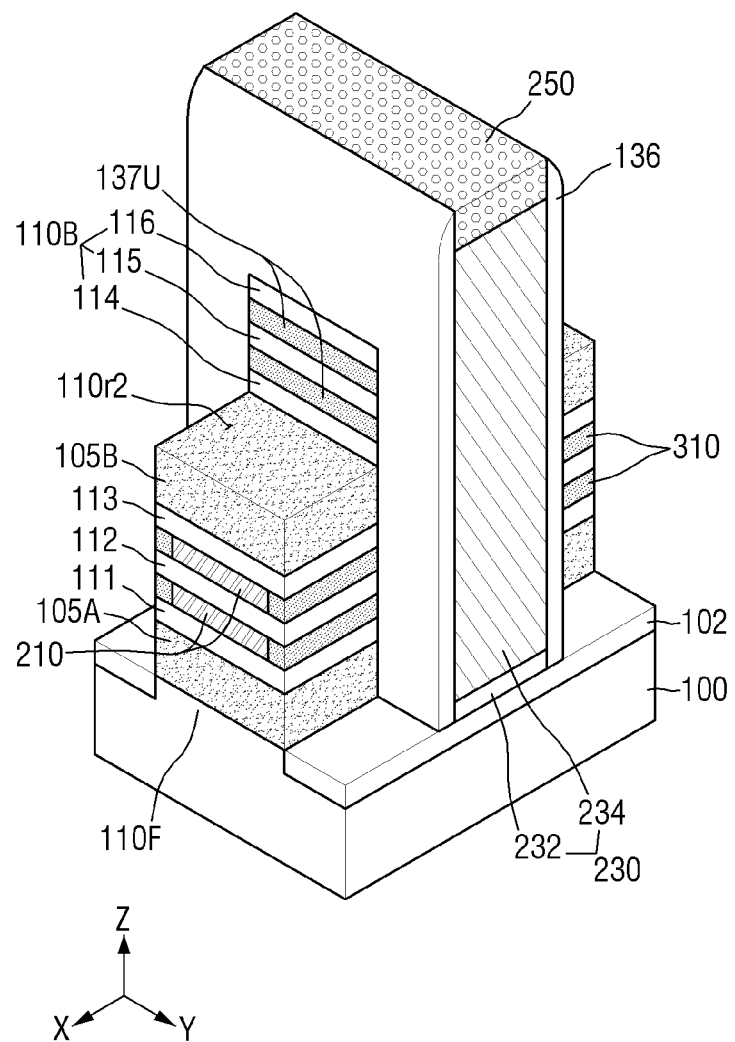

FIGS. 26 to 28 are views of intermediate operations of a method for fabricating a semiconductor device according to some embodiments. For convenience of description, portions duplicated with those described with reference to FIGS. 1 to 24 will be described briefly or omitted. For reference, FIG. 26 is a view illustrating operations subsequent to FIG. 17.

Referring to FIG. 26, the third recess process is performed for the third sacrificial patterns 210 between the upper sheet patterns (e.g., fourth to sixth sheet patterns 114 to 116) and the upper sheet patterns.

As the third recess process is performed, a portion of each of the upper sheet patterns (e.g., fourth to sixth sheet patterns 114 to 116) disposed on the upper surface of the second insulating structure 105B and outside the dummy gate structure 230 may be removed. Also, a portion of each of the third sacrificial patterns 210 disposed on the upper surface of the second insulating structure 105B and outside the dummy gate structure 230 may be removed. Therefore, the fourth recess 110r2 may be formed on the upper surface of the second insulating structure 105B. Also, the second active pattern 110B, which includes upper sheet patterns (e.g., fourth to sixth sheet patterns 114 to 116), may be formed. The fourth recess 110r2 may expose the second active pattern 110B. The third recess process may include, but is not limited to, a dry etching process.

Referring to FIG. 27, a fourth recess process is performed for the third sacrificial patterns 210 exposed by the fourth recess 110r2.

As the fourth recess process is performed, the sides of the third sacrificial patterns 210 among the upper sheet patterns (e.g., fourth to sixth sheet patterns 114 to 116) may be recessed to form a fifth recess 210r2. As the fifth recess 210r2 is formed, the upper sheet patterns (e.g., fourth to sixth sheet patterns 114 to 116) may extend past the side of each of the third sacrificial patterns 210 among the upper sheet patterns (e.g., fourth to sixth sheet patterns 114 to 116) in the first direction X.

In the first direction X, a depth at which the fifth recess 210r2 is formed is shown as being the same as the thickness of the gate spacer 136, but this is only for convenience of description. Depending on the characteristics of the fourth recess process, the depth at which the fifth recess 210r2 is formed may be deeper or shallower than the thickness of the gate spacer 136.

Referring to FIG. 28, the upper inner spacer 137U is formed.

The upper inner spacer 137U may be formed to fill the fifth recess 210r2 of FIG. 27. For example, a spacer layer conformally extending along the surface of the result of FIG. 27 may be formed. Subsequently, a recess process for the spacer layer may be performed. Therefore, the upper inner spacer 137U may be formed on the side of each of the third sacrificial patterns 210 among the upper sheet patterns (e.g., fourth to sixth sheet patterns 114 to 116).

Subsequently, the above-described operations may be performed using operations corresponding to FIGS. 18 to 24. Therefore, the semiconductor device described above may be fabricated using FIG. 6.

Figure 29:
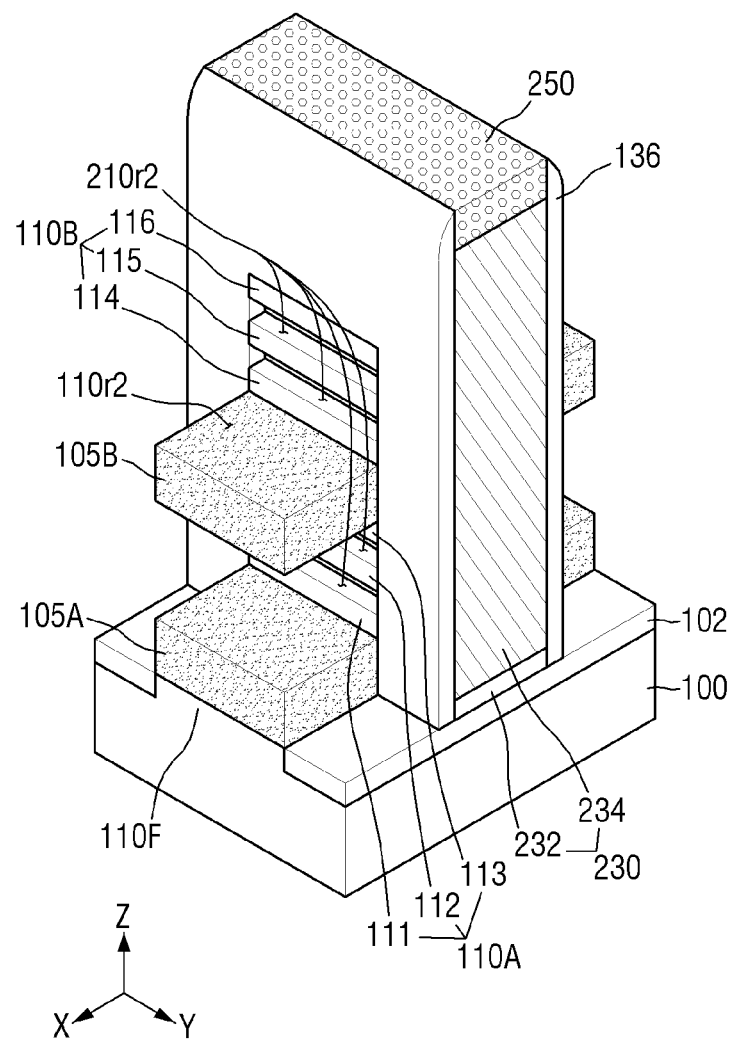
FIGS. 29 and 30 are views of intermediate operations of a method for fabricating a semiconductor device according to some embodiments.
Figure 30:
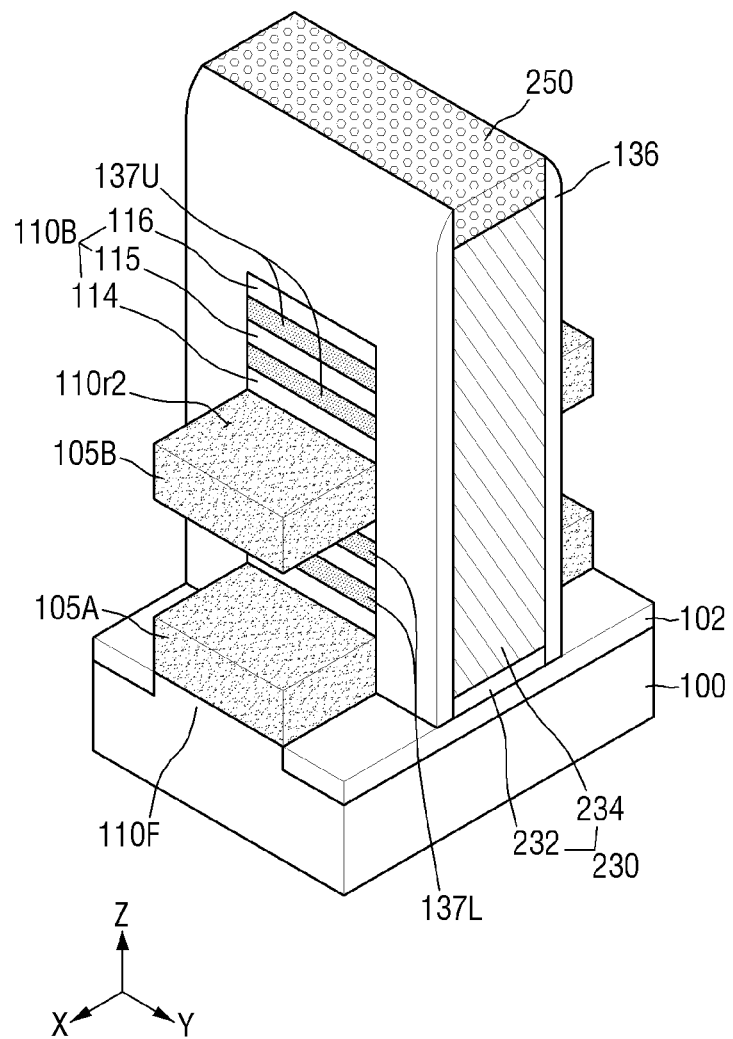

FIGS. 29 and 30 are views of intermediate operations of a method for fabricating a semiconductor device according to some embodiments. For convenience of description, portions duplicated with those described with reference to FIGS. 1 to 24 will be described briefly or omitted. For reference, FIG. 29 is a view illustrating operations subsequent to FIG. 18.

Referring to FIG. 29, a fourth recess process is performed for the third sacrificial patterns 210 exposed by the third recess 110r1 and the fourth recess 110r2.

As the fourth recess process is performed, the side of each of the third sacrificial patterns 210 may be recessed to form a fifth recess 210r2. As the fifth recess 210r2 is formed, the sheet patterns 111 to 116 may extend past the side of each of the third sacrificial patterns 210 in the first direction X.

In the first direction X, a depth at which the fifth recess 210r2 is formed is shown as being the same as the thickness of the gate spacer 136, but this is only for convenience of description. Depending on the characteristics of the fourth recess process, the depth at which the fifth recess 210r2 is formed may be deeper or shallower than the thickness of the gate spacer 136.

Referring to FIG. 30, the lower inner spacer 137L and the upper inner spacer 137U are formed.

The lower inner spacer 137L and the upper inner spacer 137U may be formed to fill the fifth recess 210r2 of FIG. 29. For example, a spacer layer conformally extending along the surface of the result of FIG. 29 may be formed. Subsequently the recess process for the spacer layer may be performed. Therefore, the lower inner spacer 137L may be formed on the side of each of the third sacrificial patterns 210 among the lower sheet patterns (e.g., first to third sheet patterns 111 to 113). Also, the upper inner spacer 137U may be formed on the side of each of the third sacrificial patterns 210 among the upper sheet patterns (e.g., fourth to sixth sheet patterns 114 to 116).

Subsequently, the above-described operations may be performed using operations corresponding to FIGS. 19 to 24. Therefore, the semiconductor device described above may be fabricated using FIG. 7.

While aspects of embodiments have been shown and described, it will be understood by those of ordinary skill in the art that various changes in form and details may be made therein without departing from the spirit and scope of the following claims.

What is claimed is:

1. A semiconductor device comprising:
   a first active pattern spaced apart from a substrate and extending in a first direction;
   a second active pattern spaced apart from the substrate and extending in the first direction, the first active pattern being provided between the second active pattern and the substrate;
   a gate structure extending in a second direction on the substrate, the first active pattern and the second active pattern passing through the gate structure, and the second direction crossing the first direction;
   a first source/drain area connected with the first active pattern and provided on a side of the gate structure;
   a second source/drain area connected with the second active pattern and provided on the first source/drain area;
   a first insulating structure provided between the substrate and the first source/drain area, wherein the first insulating structure is not provided between the substrate and the gate structure; and
   a second insulating structure provided between the first source/drain area and the second source/drain area,
   wherein the second insulating structure is offset from the first active pattern and the second active pattern along a third direction that is perpendicular to the first direction and the second direction.

2. The semiconductor device of claim 1, wherein the first source/drain area has a first conductivity type, and
   wherein the second source/drain area has a second conductivity type different from the first conductivity type.

3. The semiconductor device of claim 1, wherein the first active pattern comprises a plurality of lower sheet patterns spaced apart from each other along the third direction, and extending in the first direction, and
   wherein a distance between the substrate and the first active pattern is greater than a distance between two adjacent lower sheet patterns of the plurality of lower sheet patterns.

4. The semiconductor device of claim 3, wherein a thickness of the first insulating structure and the distance between the substrate and the first active pattern have a same value.

5. The semiconductor device of claim 1, wherein the second active pattern comprises a plurality of upper sheet patterns spaced apart from each other along the third direction, and extending in the first direction,
   wherein a distance between the first active pattern and the second active pattern is greater than a distance between two adjacent upper sheet patterns of the plurality of upper sheet patterns, and
   wherein a thickness of the second insulating structure adjacent the gate structure, and the distance between the first active pattern and the second active pattern have a same value.

6. The semiconductor device of claim 1, wherein a thickness of the second insulating structure adjacent the gate structure, and a distance between the first active pattern and the second active pattern have a same value.

7. The semiconductor device of claim 1, wherein a lower surface of the first insulating structure is coplanar with a lowest surface of the gate structure.

8. The semiconductor device of claim 1, wherein each of the first insulating structure and the second insulating structure comprises a first isolation insulating layer and a second isolation insulating layer provided on the first isolation insulating layer.

9. The semiconductor device of claim 8, wherein a dielectric constant of the second isolation insulating layer of the first insulating structure is lower than that of the first isolation insulating layer of the first insulating structure.

10. The semiconductor device of claim 1, wherein the second insulating structure is not provided between the first active pattern and the second active pattern.

11. A semiconductor device comprising:
    a first sheet pattern provided on a substrate and extending in a first direction;
    a second sheet pattern provided on and spaced apart from the first sheet pattern, and extending in the first direction;
    a third sheet pattern provided on the second sheet pattern and extending in the first direction;
    a fourth sheet pattern provided on and spaced apart from the third sheet pattern, and extending in the first direction;
    a gate structure provided on the substrate and extending in a second direction which crosses the first direction, wherein the first sheet pattern, the second sheet pattern, the third sheet pattern and the fourth sheet pattern pass through the gate structure;
    a first source/drain area connected with the first sheet pattern and the second sheet pattern, and provided on a side of the gate structure;
    a second source/drain area connected with the third sheet pattern and the fourth sheet pattern, and provided on the first source/drain area;
    a first insulating structure provided between the substrate and the first source/drain area on the side of the gate structure; and
    a second insulating structure provided between the first source/drain area and the second source/drain area on the side of the gate structure, wherein a thickness of the first insulating structure and a thickness of the second insulating structure are greater than a distance between the first sheet pattern and the second sheet pattern, and greater than a distance between the third sheet pattern and the fourth sheet pattern, and wherein the second insulating structure is offset from the second sheet pattern and the third sheet pattern along a third direction that is perpendicular to the first direction and the second direction.

12. The semiconductor device of claim 11, wherein the first source/drain area has a first conductivity type, and wherein the second source/drain area has a second conductivity type different from the first conductivity type.

13. The semiconductor device of claim 11, wherein, along the second direction, a width of the first insulating structure, a width of the first sheet pattern and a width of the second sheet pattern have a first same value, and wherein along the second direction, a width of the second insulating structure, a width of the third sheet pattern and a width of the fourth sheet pattern have a second same value.

14. The semiconductor device of claim 11, wherein the thickness of the first insulating structure and a distance between the substrate and the first sheet pattern have a same value.

15. A semiconductor device comprising:
a plurality of lower sheet patterns sequentially provided on a substrate, spaced apart from each other, and respectively extending in a first direction;
a plurality of upper sheet patterns sequentially provided on the plurality of lower sheet patterns, spaced apart from each other, and respectively extending in the first direction;
a gate structure provided on the substrate and extending in a second direction crossing the first direction on the substrate, wherein the plurality of lower sheet patterns and the plurality of upper sheet patterns pass through the gate structure;
a first source/drain area connected with the plurality of lower sheet patterns, provided on a side of the gate structure, and having a first conductivity type;
a second source/drain area connected with the plurality of upper sheet patterns, provided on the first source/drain area, and having a second conductivity type different from the first conductivity type;
a first insulating structure provided between the substrate and the first source/drain area, wherein the first insulating structure is not provided between the substrate and the gate structure; and a second insulating structure provided between the first source/drain area and the second source/drain area on the side of the gate structure, wherein a first distance between the substrate and the plurality of lower sheet patterns and a second distance between the plurality of lower sheet patterns and the plurality of upper sheet patterns are both greater than each of a third distance between two adjacent lower sheet patterns of the plurality of lower sheet patterns, and a fourth distance between two adjacent upper sheet patterns of the plurality of upper sheet patterns, and wherein the second insulating structure is offset from the plurality of lower sheet patterns and the plurality of upper sheet patterns along a third direction that is perpendicular to the first direction and the second direction.

16. The semiconductor device of claim 15, wherein a first thickness of the first insulating structure and the first distance have a first same value, and wherein a second thickness of the second insulating structure and the second distance have a second same value.

17. The semiconductor device of claim 15, further comprising an upper inner spacer provided between the gate structure and the second source/drain area, and between the plurality of upper sheet patterns.

18. The semiconductor device of claim 17, further comprising a lower inner spacer provided between the gate structure and the first source/drain area, and between the plurality of lower sheet patterns.

19. The semiconductor device of claim 15, wherein the gate structure comprises:
a gate electrode;
a gate spacer extending along a side of the gate electrode; and
a gate dielectric layer provided between the substrate and the gate electrode, and between the gate electrode and the gate spacer.

20. The semiconductor device of claim 15, further comprising:
a first source/drain contact connected with the first source/drain area, and passing through the second source/drain area and the second insulating structure; and
a second source/drain contact connected with the second source/drain area.

* * * * *